(12) United States Patent
Chen et al.

(10) Patent No.: US 12,684,884 B2
(45) Date of Patent: Jul. 14, 2026

(54) IMAGE SENSOR, IMAGING LENS ASSEMBLY MODULE AND ELECTRONIC DEVICE

(71) Applicant: Largan Industrial Optics Co., Ltd., Taichung City (TW)

(72) Inventors: Tzu-Kan Chen, Taichung City (TW); Chen-Wei Fan, Taichung City (TW); Wen-Yu Tsai, Taichung City (TW)

(73) Assignee: LARGAN INDUSTRIAL OPTICS CO., LTD., Taichung City (TW)

( * ) Notice: Subject to any disclaimer, the term of this patent is extended or adjusted under 35 U.S.C. 154(b) by 386 days.

(21) Appl. No.: 18/346,901

(22) Filed: Jul. 5, 2023

(65) Prior Publication Data

US 2024/0014234 A1      Jan. 11, 2024

Related U.S. Application Data

(60) Provisional application No. 63/367,819, filed on Jul. 7, 2022.

(51) Int. Cl.
H10F 39/00           (2025.01)
(52) U.S. Cl.
CPC ..... *H10F 39/8057* (2025.01); *H10F 39/8053* (2025.01); *H10F 39/8063* (2025.01)
(58) Field of Classification Search
CPC ............. H10F 39/8057; H10F 39/8053; H10F 39/8063; H10F 39/804; H10F 39/806; H10F 39/805
See application file for complete search history.

(56) References Cited

U.S. PATENT DOCUMENTS

| | | | |
|---|---|---|---|
| 6,493,144 B2 | 12/2002 | Tanaka et al. | |
| 6,972,136 B2 | 12/2005 | Koenig et al. | |
| 9,709,704 B2 | 7/2017 | Miyahara et al. | |
| 2012/0044395 A1 | 2/2012 | Del Monte | |
| 2017/0160437 A1 | 6/2017 | Nakayama | |
| 2019/0319053 A1* | 10/2019 | Suzuki | H04N 25/70 |
| 2021/0003753 A1 | 1/2021 | Kim et al. | |
| 2021/0072439 A1 | 3/2021 | Cho et al. | |
| 2021/0109267 A1 | 4/2021 | Houck | |

(Continued)

FOREIGN PATENT DOCUMENTS

CN          216900993 U      7/2022

*Primary Examiner* — Jonathan Han

(74) *Attorney, Agent, or Firm* — McClure, Qualey & Rodack, LLP

(57)          ABSTRACT

An image sensor includes an image sensor die, a light transmitting element, at least one anti-reflection coating and at least one anti-reflection structure. The image sensor die includes a photoelectric conversion layer and a micro lens layer. The micro lens layer is disposed above the photoelectric conversion layer for converging the light onto the photoelectric conversion layer. The light transmitting element is disposed above the micro lens layer, and a gap is formed between the light transmitting element and the micro lens layer, the light passes through the light transmitting element and then travels into the image sensor. The anti-reflection coating is at least disposed on an upper surface of the light transmitting element. The anti-reflection structure is disposed on at least one of a lower surface of the light transmitting element and the micro lens layer.

28 Claims, 15 Drawing Sheets

(56)     References Cited

U.S. PATENT DOCUMENTS

2021/0136264 A1     5/2021   Kim et al.
2022/0139980 A1     5/2022   Lin
2022/0407993 A1*   12/2022   Tsai  ...................... H10F 39/805

* cited by examiner

110

210

220

223

2101

2104

2102

230

210

310

310

40

440

430

420

410

IMAGE SENSOR, IMAGING LENS ASSEMBLY MODULE AND ELECTRONIC DEVICE

RELATED APPLICATIONS

This application claims priority to Provisional Application Ser. No. 63/367,819, filed Jul. 7, 2022, which is herein incorporated by reference.

BACKGROUND

Technical Field

The present disclosure relates to an image sensor and an imaging lens assembly module. More particularly, the present disclosure relates to an image sensor and an imaging lens assembly module applicable to portable electronic devices.

Description of Related Art

In the conventional imaging lens assembly, the reflection of stray light between the components inside the image sensor will be generated, which would affect the image quality. FIG. 5 is a schematic view of a light transmitting element 51 and an image sensor die 52 of an image sensor of an imaging lens assembly module 5 in the prior art. In FIG. 5, the micro lens layer 521 of the prior art is directly disposed on the surface facing toward the object side of the image sensor die 52, and directly receives the light IL from the light transmitting element 51. The reflection of stray light will be generated between the micro lens layer 521 and the light transmitting element 51 which will affect the image quality. Therefore, there is an urgent need for the industry to find a solution about how to reduce the reflection of stray light inside the image sensor.

SUMMARY

According to one aspect of the present disclosure, an image sensor includes an image sensor die, a light transmitting element, at least one anti-reflection coating and at least one anti-reflection structure. The image sensor die includes a photoelectric conversion layer and a micro lens layer. The photoelectric conversion layer is for converting a light into an electronic signal. The micro lens layer is disposed above the photoelectric conversion layer for converging the light onto the photoelectric conversion layer. The light transmitting element is disposed above the micro lens layer, and a gap is formed between the light transmitting element and the micro lens layer, the light passes through the light transmitting element and then traveling into the image sensor. The light transmitting element includes a lower surface and an upper surface, wherein the lower surface is disposed corresponding to the micro lens layer, and the upper surface is disposed relative to the lower surface. The anti-reflection coating is at least disposed on the upper surface of the light transmitting element, wherein the anti-reflection coating includes a plurality of high refractive index layers and a plurality of low refractive index layers, which is alternately stacked by the high refractive index layers and the low refractive index layers. The anti-reflection structure is disposed on at least one of the lower surface of the light transmitting element and the micro lens layer. The anti-reflection structure includes a plurality of ridge-like protrusions which are non-directionally extended from a disposing surface, wherein a bottom of each of the ridge-like protrusions is closer to the disposing surface than a top of each of the ridge-like protrusions to the disposing surface, and each of the ridge-like protrusions is tapered from the bottom to the top.

According to one aspect of the present disclosure, an imaging lens assembly module includes the image sensor of the aforementioned aspect and an imaging lens assembly. The imaging lens assembly is disposed corresponding to the image sensor, and the image lens assembly includes at least one lens element.

According to one aspect of the present disclosure, an electronic device includes the imaging lens assembly module of the aforementioned aspect.

According to one aspect of the present disclosure, an image sensor includes an image sensor die, a light transmitting element, at least one anti-reflection coating and at least one anti-reflection structure. The image sensor die includes a photoelectric conversion layer and a micro lens layer. The photoelectric conversion layer is for converting a light into an electronic signal. The micro lens layer is disposed above the photoelectric conversion layer for converging the light onto the photoelectric conversion layer. The light transmitting element is disposed above the micro lens layer, and a gap is formed between the light transmitting element and the micro lens layer, the light passes through the light transmitting element and then traveling into the image sensor. The light transmitting element includes a lower surface and an upper surface, wherein the lower surface is disposed corresponding to the micro lens layer, and the upper surface is disposed relative to the lower surface. The anti-reflection coating is disposed on at least one of the upper surface and the lower surface of the light transmitting element and the micro lens layer, wherein the anti-reflection coating includes a plurality of high refractive index layers and a plurality of low refractive index layers, which is alternately stacked by the high refractive index layers and the low refractive index layers. The anti-reflection structure is disposed on at least one of the upper surface and the lower surface of the light transmitting element and the micro lens layer. The anti-reflection structure includes a plurality of ridge-like protrusions which are non-directionally extended from a disposing surface, wherein a bottom of each of the ridge-like protrusions is closer to the disposing surface than a top of each of the ridge-like protrusions to the disposing surface, and each of the ridge-like protrusions is tapered from the bottom to the top. When an average reflectance of a surface with the at least one anti-reflection coating corresponding to the light with a wavelength from 440 nm to 680 nm is $R_{4468}$, the following condition is satisfied: $0.08\% \leq R_{4468} \leq 0.5\%$.

According to one aspect of the present disclosure, an imaging lens assembly module includes the image sensor of the aforementioned aspect and an imaging lens assembly. The imaging lens assembly is disposed corresponding to the image sensor, and the image lens assembly includes at least one lens element.

According to one aspect of the present disclosure, an electronic device includes the imaging lens assembly module of the aforementioned aspect.

BRIEF DESCRIPTION OF THE DRAWINGS

The present disclosure can be more fully understood by reading the following detailed description of the embodiment, with reference made to the accompanying drawings as follows.

DETAILED DESCRIPTION

Figure 1A:
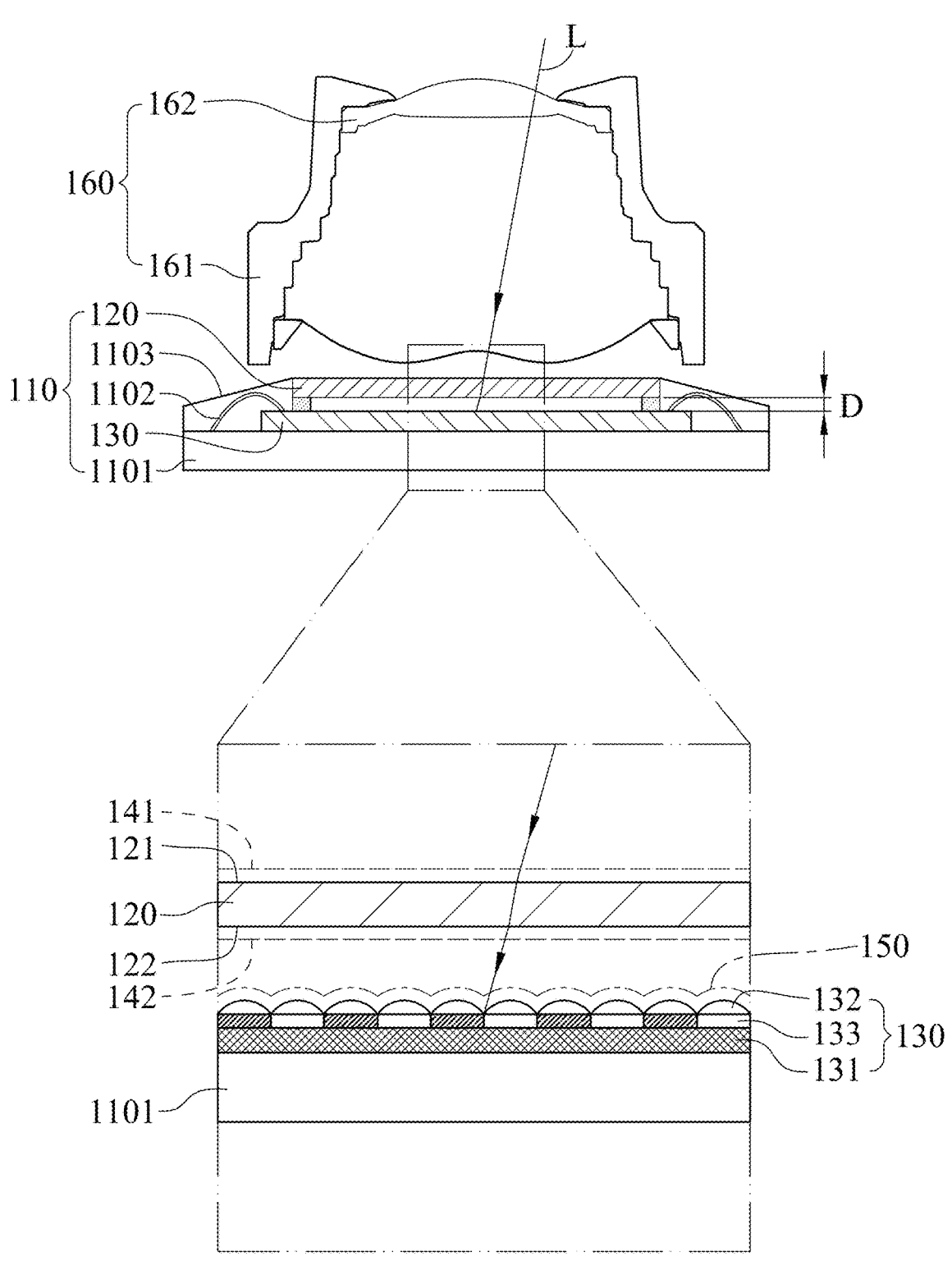
FIG. 1A is a schematic view of an imaging lens assembly module according to the 1 st embodiment of the present disclosure.

According to one aspect of the present disclosure, an image sensor includes an image sensor die, a light transmitting element, at least one anti-reflection coating and at least one anti-reflection structure. The image sensor die includes a photoelectric conversion layer and a micro lens layer. The photoelectric conversion layer is for converting a light into an electronic signal. The micro lens layer is disposed above the photoelectric conversion layer for converging the light onto the photoelectric conversion layer. The light transmitting element is disposed above the micro lens layer, and a gap is formed between the light transmitting element and the micro lens layer, the light passes through the light transmitting element and then travels into the image sensor. The light transmitting element includes a lower surface and an upper surface, wherein the lower surface is disposed corresponding to the micro lens layer, the upper surface is disposed relative to the lower surface. The anti-reflection coating is at least disposed on the upper surface of the light transmitting element, wherein the anti-reflection coating includes a plurality of high refractive index layers and a plurality of low refractive index layers, which is alternately stacked by the high refractive index layers and the low refractive index layers. The anti-reflection structure is disposed on at least one of the lower surface of the light transmitting element and the micro lens layer. The anti-reflection structure includes a plurality of ridge-like protrusions which are non-directionally extended from a disposing surface, wherein a bottom of each of the ridge-like protrusions is closer to the disposing surface than a top of each of the ridge-like protrusions to the disposing surface, and each of the ridge-like protrusions is tapered from the bottom to the top. Hence, it is favorable for reducing the reflection of stray light inside the image sensor by disposing the anti-reflection coating and the anti-reflection structure on the light transmitting element and the micro lens layer of the image sensor. Further, the anti-reflection coating is more stable than the anti-reflection structure, which is preferably disposed on the upper surface of the light transmitting element, so that the coating layer structure can prevent from the effects of external factors, wherein the external factors can be collision of external force, temperature variation, humidity variation, etc., but will not be limited thereto; the anti-reflection structure can reduce the reflectance by the principle of gradient refractive index, which can maintain the lower reflectance corresponding to the wide-band wavelength of light. Therefore, it is favorable for obtaining the balance between the optical performance and reliability of the image sensor by cooperating the anti-reflection coating and the anti-reflection structure.

Furthermore, the photoelectric conversion layer can include a photodiode and a circuit construction. The photodiode can be used for converting the light signal into the electronic signal, and the circuit construction can be used for transmission and signal gain of the electronic signal.

When an average reflectance of a surface with the anti-reflection coating corresponding to the light with the wavelength from 440 nm to 680 nm is $R_{4468}$, the following condition is satisfied: $0.08\% \le R_{4468} \le 0.5\%$. Therefore, it is favorable for increasing the transmittance of visible light by maintaining low reflectance of light with the corresponding wavelength.

When an average reflectance of the surface with the anti-reflection coating corresponding to the light with the wavelength from 680 nm to 800 nm is $R_{6880}$, the following condition is satisfied: $0.08\% \le R_{6880} \le 0.6\%$. Therefore, it is favorable for reducing the specific stray light by maintaining low reflectance of light with the corresponding wavelength.

When an average reflectance of the surface with the anti-reflection coating corresponding to the light with the wavelength from 420 nm to 450 nm is $R_{4245}$, the following condition is satisfied: $0.06\% \le R_{4245} \le 0.4\%$. Therefore, it is favorable for reducing the specific stray light by maintaining low reflectance of light with the corresponding wavelength.

When an average reflectance of a surface with the anti-reflection structure corresponding to the light with the wavelength from 380 nm to 880 nm is $R_{3888}$, the following condition is satisfied: $0.01\% \le R_{3888} \le 0.3\%$. Therefore, it is favorable for enhancing the anti-reflection performance by maintaining low reflectance of light with the corresponding wide-band wavelength.

An average structure height of the ridge-like protrusions can be larger than or equal to 70 nm, and smaller than or equal to 350 nm. Therefore, it is easier to produce and provides the capability of mass production. In detail, the average structure height of the ridge-like protrusions is the average height of structure heights of at least three or more of the ridge-like protrusions. The structure height of each ridge-like protrusion can be defined as, observed from the side cross-sectional view (which is destructive measurement), a vertical height H1 from an absolute bottom of each ridge-like protrusion (which is the foot of each ridge-like protrusion) to the top of each ridge-like protrusion (which is the top of each ridge-like protrusion); or observed from the appearance (which is non-destructive measurement), a vertical height H2 from an relative bottom of each ridge-like protrusion (which is the valley between two of the ridge-like protrusions) to the top of each ridge-like protrusion (which is the top of each ridge-like protrusion).

The anti-reflection structure can further include a structure connecting layer, the structure connecting layer includes at least one $SiO_2$ layer, wherein a top of the at least one $SiO_2$ layer and the bottom of each of the ridge-like protrusions are physically contacted. Therefore, it is favorable for enhancing the attachment stability of the ridge-like protrusions so as to attach stably on different material. Further, a partial region of the top of the $SiO_2$ layer is contacted with an air. Hence, the ridge-like protrusions have tiny pore, and the partial region of the top of the $SiO_2$ layer can be contacted with air, so that it is favorable for adjusting the equivalent refractive index of the anti-reflection structure.

The light transmitting element can include a light absorbing material. Specifically, the light transmitting element can be glass material or plastic material, and will not be limited thereto. Hence, the light transmitting element can absorb light with partial wavelength by adding the light absorbing material into the light transmitting element, it is favorable for further enhancing the image quality.

The light transmitting element can further include a light blocking structure, which is for blocking the light. Specifically, the light blocking structure can be a black coating for blocking light, and can be disposed on the peripheral region of the light transmitting element so as to avoid the reflection of stray light by the peripheral components of the image sensor die.

An enclosed space can be formed between the light transmitting element and the micro lens layer. Therefore, the anti-reflection structure and the anti-reflection coating can be protected so as to reduce the effect from the external factors.

When a distance of the gap between the light transmitting element and the micro lens layer is D, the following condition is satisfied: 0.01 mm≤D≤0.15 mm. Therefore, it is favorable for the design of the compactness of the image sensor.

According to one aspect of the present disclosure, an imaging lens assembly module includes the image sensor of the foregoing aspect and an imaging lens assembly. The imaging lens assembly is disposed corresponding to the image sensor, and the image lens assembly includes at least one lens element.

According to one aspect of the present disclosure, an electronic device includes the imaging lens assembly module of the foregoing aspect.

According to one aspect of the present disclosure, an image sensor includes an image sensor die, a light transmitting element, at least one anti-reflection coating and at least one anti-reflection structure. The image sensor die includes a photoelectric conversion layer and a micro lens layer. The photoelectric conversion layer is for converting a light into an electronic signal. The micro lens layer is disposed above the photoelectric conversion layer for converging the light onto the photoelectric conversion layer. The light transmitting element is disposed above the micro lens layer, and a gap is formed between the light transmitting element and the micro lens layer, the light passes through the light transmitting element and then travels into the image sensor. The light transmitting element includes a lower surface and an upper surface, wherein the lower surface is disposed corresponding to the micro lens layer, and the upper surface is disposed relative to the lower surface. The anti-reflection coating is disposed on at least one of the upper surface and the lower surface of the light transmitting element and the micro lens layer, wherein the anti-reflection coating includes a plurality of high refractive index layers and a plurality of low refractive index layers, which is alternately stacked by the high refractive index layers and the low refractive index layers. The anti-reflection structure is disposed on at least one of the upper surface and the lower surface of the light transmitting element and the micro lens layer. The anti-reflection structure includes a plurality of ridge-like protrusions which are non-directionally extended from a disposing surface, wherein a bottom of each of the ridge-like protrusions is closer to the disposing surface than a top of each of the ridge-like protrusions to the disposing surface, and each of the ridge-like protrusions is tapered from the bottom to the top. When an average reflectance of a surface with the at least one anti-reflection coating corresponding to the light with the wavelength from 440 nm to 680 nm is $R_{4468}$, the following condition is satisfied: 0.08%≤$R_{4468}$≤0.5%. Hence, it is favorable for reducing the reflection of stray light inside the image sensor by disposing the anti-reflection coating and the anti-reflection structure on the light transmitting element and the micro lens layer of the image sensor. Further, the anti-reflection coating is more stable than the anti-reflection structure, which is preferably disposed on the upper surface of the light transmitting element, so that the coating layer structure can prevent from the effects of external factors; the anti-reflection structure can reduce the reflectance by the principle of gradient refractive index, which can maintain the lower reflectance corresponding to the wide-band wavelength of light. Therefore, it is favorable for obtaining the balance between the optical performance and reliability of the image sensor by cooperating the anti-reflection coating and the anti-reflection structure.

Furthermore, the photoelectric conversion layer can include a photodiode and a circuit construction. The photodiode can be used for converting the light signal into the electronic signal, and the circuit construction can be used for transmission and signal gain of the electronic signal.

The anti-reflection coating is disposed on at least the upper surface of the light transmitting element. The upper surface of the light transmitting element is easier to be affected by the external factors, and the anti-reflection coating is preferable to bear the impact of the external factors, so that the coating layer structure can prevent from the effects thereof. Specifically, the external factors can be collision if external force, temperature variation, humidity variation, etc., but will not be limited thereto.

When an average reflectance of the surface with the anti-reflection coating corresponding to the light with the wavelength from 680 nm to 800 nm is $R_{6880}$, the following condition is satisfied: 0.08%≤$R_{6880}$≤0.6%. Therefore, it is favorable for reducing the specific stray light by maintaining low reflectance of light with the corresponding wavelength.

When an average reflectance of the surface with the anti-reflection coating corresponding to the light with the wavelength from 420 nm to 450 nm is $R_{4245}$, the following condition is satisfied: 0.06%≤$R_{4245}$≤0.4%. Therefore, it is favorable for reducing the specific stray light by maintaining low reflectance of light with the corresponding wavelength.

When an average reflectance of a surface with the anti-reflection structure corresponding to the light with the wavelength from 380 nm to 880 nm is $R_{3888}$, the following condition is satisfied: $0.01\% \leq R_{3888} \leq 0.3\%$. Therefore, it is favorable for enhancing the anti-reflection performance by maintaining low reflectance of light with the corresponding wide-band wavelength.

An average structure height of the ridge-like protrusions can be larger than or equal to 70 nm, and smaller than or equal to 350 nm. Therefore, it is easier to produce and provides the capability of mass production. In detail, the average structure height of the ridge-like protrusions is the average height of structure heights of at least three or more of the ridge-like protrusions. The structure height of each ridge-like protrusion can be defined as, observed from the side cross-sectional view (which is destructive measurement), a vertical height H1 from an absolute bottom of each ridge-like protrusion (which is the foot of each ridge-like protrusion) to the top of each ridge-like protrusion (which is the top of each ridge-like protrusion); or observed from the appearance (which is non-destructive measurement), a vertical height H2 from an relative bottom of each ridge-like protrusion (which is the valley between two of the ridge-like protrusions) to the top of each ridge-like protrusion (which is the top of each ridge-like protrusion).

The anti-reflection structure can further include a structure connecting layer, the structure connecting layer includes at least one $SiO_2$ layer, wherein a top of the at least one $SiO_2$ layer and the bottom of each of the ridge-like protrusions are physically contacted. Therefore, it is favorable for enhancing the attachment stability of the ridge-like protrusions so as to attach stably on different material. Further, a partial region of the top of the $SiO_2$ layer is contacted with an air. Hence, the ridge-like protrusions have tiny pore, and the partial region of the top of the $SiO_2$ layer can be contacted with air, so that it is favorable for adjusting the equivalent refractive index of the anti-reflection structure.

The light transmitting element can include a light absorbing material. Specifically, the light transmitting element can be glass material or plastic material, and will not be limited thereto. Hence, the light transmitting element can absorb light with partial wavelength by adding the light absorbing material into the light transmitting element, it is favorable for further enhancing the image quality.

An enclosed space can be formed between the light transmitting element and the micro lens layer. Therefore, the anti-reflection structure and the anti-reflection coating can be protected so as to reduce the effect from the external factors.

When a distance of the gap between the light transmitting element and the micro lens layer is D, the following condition is satisfied: $0.01 \text{ mm} \leq D \leq 0.15 \text{ mm}$. Therefore, it is favorable for the design of the compactness of the image sensor.

According to one aspect of the present disclosure, an imaging lens assembly module includes the image sensor of the foregoing aspect and an imaging lens assembly. The imaging lens assembly is disposed corresponding to the image sensor, and the image lens assembly includes at least one lens element.

According to one aspect of the present disclosure, an electronic device includes the imaging lens assembly module of the foregoing aspect.

1st Embodiment

Figures 1B, 1C:
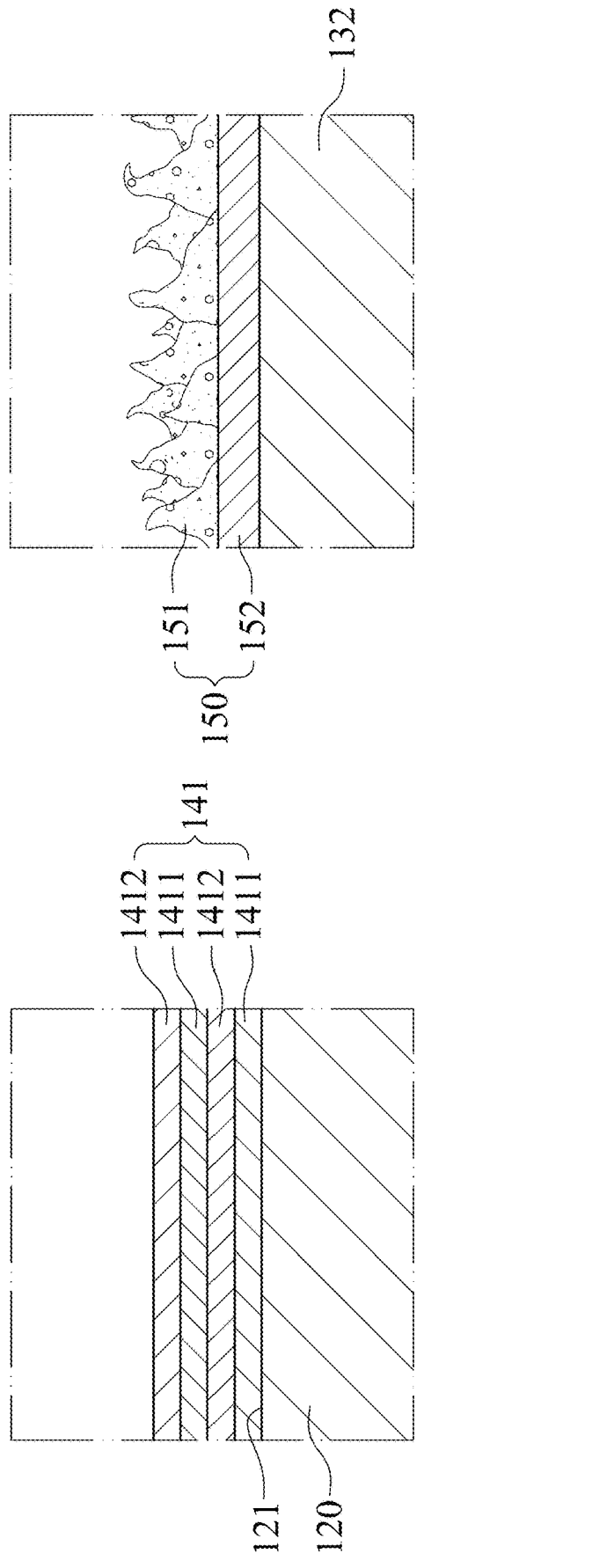
FIG. 1B is a schematic view of the light transmitting element and the anti-reflection coating according to the 1st embodiment of FIG. 1A.
FIG. 1C is a schematic view of the micro lens layer and the anti-reflection structure according to the 1st embodiment of FIG. 1A.

FIG. 1A is a schematic view of an imaging lens assembly module 100 according to the 1st embodiment of the present disclosure. FIG. 1B is a schematic view of the light transmitting element 120 and the anti-reflection coating 141 according to the 1st embodiment of FIG. 1A. FIG. 1C is a schematic view of the micro lens layer 132 and the anti-reflection structure 150 according to the 1st embodiment of FIG. 1A. In FIG. 1A, the imaging lens assembly module 100 includes an image sensor 110 and an imaging lens assembly 160, wherein the imaging lens assembly 160 is disposed corresponding to the image sensor 110. In detail, the imaging lens assembly 160 includes a lens barrel 161 and at least one lens element 162. The lens element 162 is disposed in the lens barrel 161, the image sensor 110 is disposed on an image surface (its reference numeral is omitted) of the imaging lens assembly 160, correspondingly.

The image sensor 110 includes an image sensor die 130, the light transmitting element 120, two anti-reflection coatings 141, 142 and the anti-reflection structure 150. According to the 1 st embodiment, the anti-reflection coating 141, the light transmitting element 120, the anti-reflection coating 142, the anti-reflection structure 150 and the image sensor die 130 are disposed in order from an object side to an image side of the imaging lens assembly module 100, and the image sensor die 130 is disposed on a substrate 1101, but the present disclosure will not be limited to the aforementioned arrangement.

The image sensor die 130 includes a photoelectric conversion layer 131 and a micro lens layer 132, wherein the photoelectric conversion layer 131 is for converting a light into an electronic signal, and the micro lens layer 132 is disposed above the photoelectric conversion layer 131 for converging the light onto the photoelectric conversion layer 131. In particular, the photoelectric conversion layer 131 can include a photodiode (not shown) and a circuit construction (not shown). The photodiode is for converting the light signal into the electronic signal, and the circuit construction is for transmission and signal gain of the electronic signal. Further, the image sensor die 130 can further include a filter layer 133, which is disposed between the photoelectric conversion layer 131 and the micro lens layer 132, and is arranged in array corresponding to the micro lens layer 132. The filter layer 133 is for the light of the specific wavelength to pass through, wherein the specific wavelength can be red light, green light, blue light, yellow light, etc., but will not be limited thereto. The micro lens layer 132, the filter layer 133 and the photoelectric conversion layer 131 are disposed in order from the object side to the image side of the imaging lens assembly module 100, and the photoelectric conversion layer 131 is disposed on the substrate 1101.

The light transmitting element 120 is disposed above the micro lens layer 132, and there is a gap formed between the light transmitting element 120 and the micro lens layer 132 (in the 1st embodiment, a distance of the gap between the light transmitting element 120 and the micro lens layer 132 is D, D=0.12). The light L passes through the light transmitting element 120 and incidents into the image sensor 110. The light transmitting element 120 includes a lower surface 122 and an upper surface 121, wherein the lower surface 122 is disposed corresponding to the micro lens layer 132, and the upper surface 121 is disposed relative to the lower surface 122. The material of the light transmitting element 120 includes a light absorbing material, which can be glass material or plastic material, but will not be limited thereto. Specifically, the light absorbing material can be configured on demand, so that the light transmitting element 120 can absorb the light with part of wavelength.

According to the 1 st embodiment, the image sensor 110 includes two anti-reflection coatings 141, 142, and also in FIG. 1B, the anti-reflection coating 141 is disposed on the upper surface 121 of the light transmitting element 120, the anti-reflection coating 141 includes a plurality of high refractive index layers 1411 and a plurality of low refractive index layers 1412, which is alternately stacked by the high refractive index layers 1411 and the low refractive index layers 1412. In the anti-reflection coating 141, each of a number of the high refractive index layers 1411 and a number of the low refractive index layers 1412 is two, but the present disclosure will not be limited thereto.

Moreover, the anti-reflection coating 142 is disposed on the lower surface 122 of the light transmitting element 120, which also includes a plurality of high refractive index layers (not shown) and a plurality of low refractive index layers (not shown), which is alternately stacked by the high refractive index layers and the low refractive index layers, and will not be described herein again.

In FIG. 1A and FIG. 1C, the anti-reflection structure 150 is disposed on the micro lens layer 132, the anti-reflection structure 150 includes a plurality of ridge-like protrusions 151 which are non-directionally extended from a disposing surface, wherein a bottom of each of the ridge-like protrusions 151 is closer to the disposing surface than a top of each of the ridge-like protrusions 151 to the disposing surface, and each of the ridge-like protrusions 151 is tapered from the bottom to the top. Furthermore, the anti-reflection structure 150 can further include a structure connecting layer 152, the structure connecting layer 152 includes at least one $SiO_2$ layer, wherein a top of the $SiO_2$ layer and the bottom of each of the ridge-like protrusions 151 are physically contacted. In detail, the $SiO_2$ layer of the structure connecting layer 152 can be deemed as the aforementioned disposing surface, and the ridge-like protrusions 151 are disposed thereon, the top of the $SiO_2$ layer can be physically contacted with the bottom of each of the ridge-like protrusions 151. Moreover, the part of the top of the $SiO_2$ layer is contacted with the air, that is, the bottom of the ridge-like protrusions 151 does not completely cover the entire area of the top of the $SiO_2$ layer.

Figure 1E:
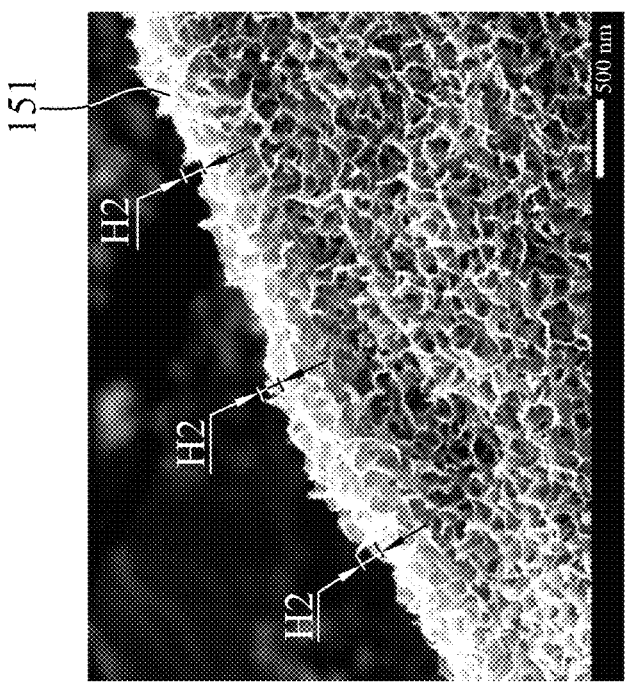
FIG. 1E is a picture of an outer surface of the ridge-like protrusions according to the 1st embodiment of FIG. 1C captured by SEM.
Figure 1D:
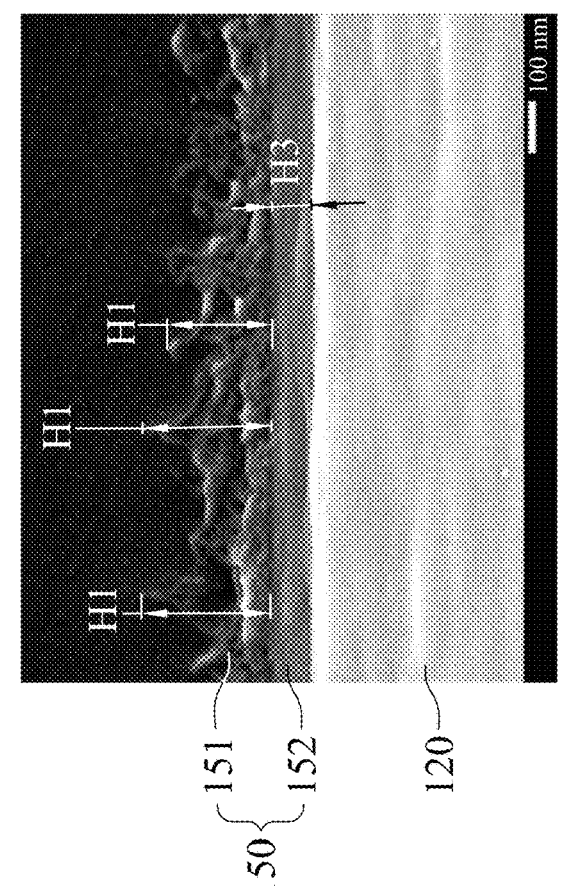
FIG. 1D is a picture of a side cross-sectional view of the anti-reflection structure according to the 1st embodiment of FIG. 1C captured by SEM.

Further, an average structure height of the ridge-like protrusions 151 is larger than or equal to 70 nm, and smaller than or equal to 350 nm. FIG. 1D is a picture of a side cross-sectional view of the anti-reflection structure 150 according to the 1st embodiment of FIG. 1C captured by SEM (Scanning Electron Microscope). FIG. 1E is a picture of an outer surface of the ridge-like protrusions 151 according to the 1st embodiment of FIG. 1C captured by SEM. In FIG. 1D, the structure height of each ridge-like protrusion 151 can be defined as, observed from the side cross-sectional view (which is destructive measurement), a vertical height H1 from an absolute bottom of each ridge-like protrusion 151 (which is the foot of each ridge-like protrusion 151 in FIG. 1D) to the top of each ridge-like protrusion 151 (which is the top of each ridge-like protrusion 151 in FIG. 1D), wherein the three values of H1 are taken as examples, from left to right in FIG. 1D, H1 can be 248.7 nm, 247.4 nm, 203 nm. Further, in FIG. 1D, the height of the structure connecting layer 152 is H3, H3=75.15 nm. In FIG. 1E, the structure height of each ridge-like protrusion 151 can also be defined as observed from the appearance (which is non-destructive measurement), a vertical height H2 from an relative bottom of each ridge-like protrusion 151 (which is the valley between two of the ridge-like protrusions 151 in FIG. 1E) to the top of each ridge-like protrusion 151 (which is the top of each ridge-like protrusion 151 in FIG. 1E), wherein the three values of H2 are taken as examples, from left to right in FIG. 1E, H2 can be 143.6 nm, 143.1 nm, 131.5 nm. It should be mentioned that the present disclosure will not be limited to the aforementioned values.

Figure 1G:
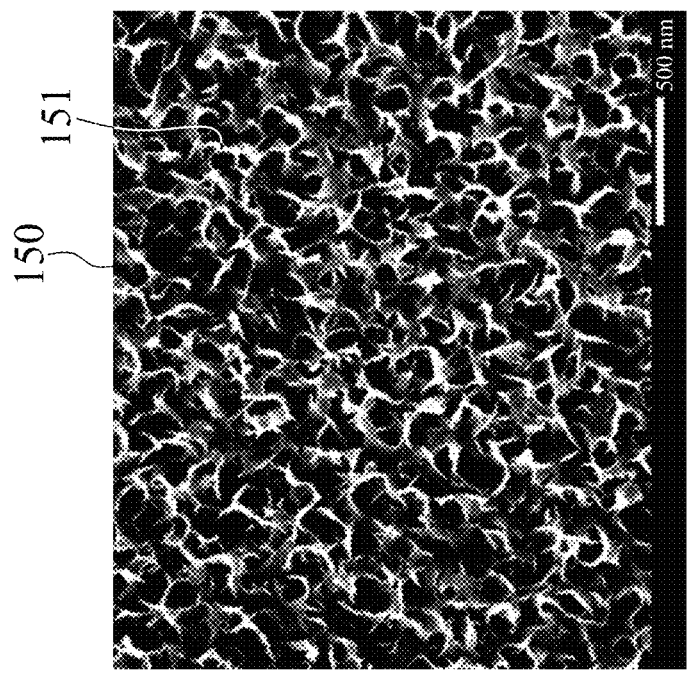
FIG. 1G is a picture of a top view of the anti-reflection structure according to the 1st embodiment of FIG. 1A captured by SEM.
Figure 1F:
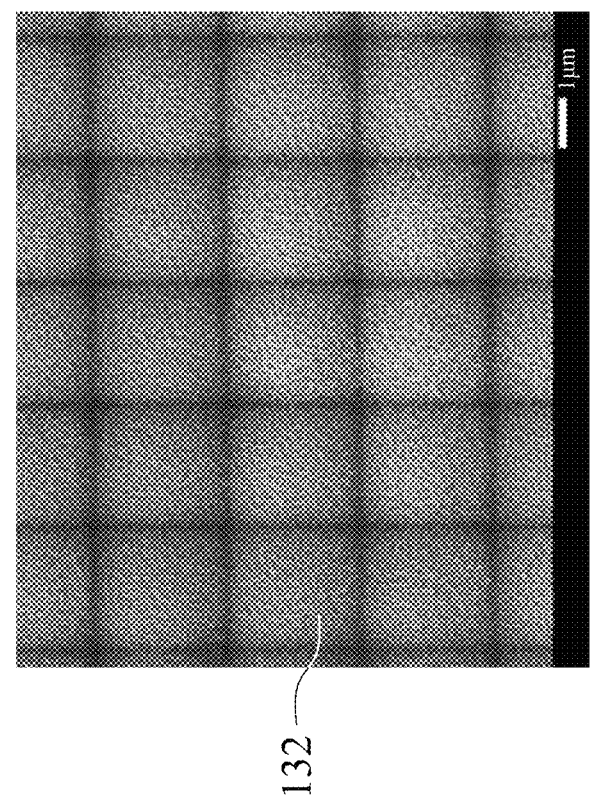
FIG. 1F is a picture of a top view of the micro lens layer according to the 1 st embodiment of FIG. 1A captured by SEM.

FIG. 1F is a picture of a top view of the micro lens layer 132 according to the 1st embodiment of FIG. 1A captured by SEM. FIG. 1G is a picture of a top view of the anti-reflection structure 150 according to the 1st embodiment of FIG. 1A captured by SEM. In FIG. 1F, each lattice is a micro lens unit (its reference numeral is omitted), and the anti-reflection structure (its reference numeral is omitted in FIG. 1F) is disposed on the surface of the micro lens unit. The specification of the micro lens units of the micro lens layer 132 can be adjusted depend on the image sensor 110 to be disposed, but will not be limited thereto. In FIG. 1G, the ridge-like protrusions 151 which are non-directionally extended from a disposing surface can be seen from the picture of the top view of the anti-reflection structure 150.

Figure 1H:
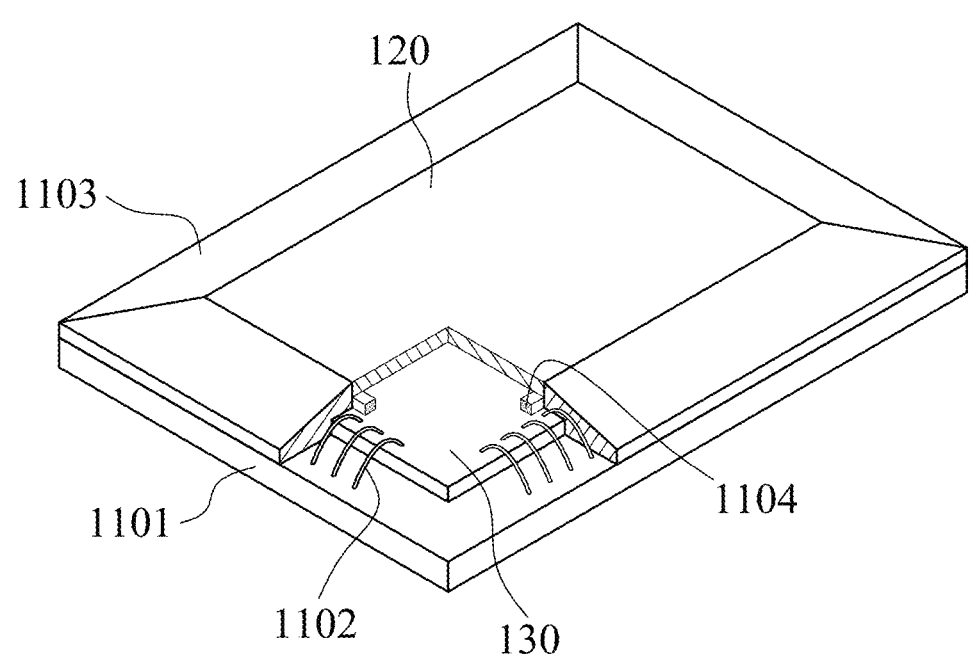
FIG. 1H is a three-dimensional schematic view of the image sensor according to the 1st embodiment of FIG. 1A.
Figure 1I:
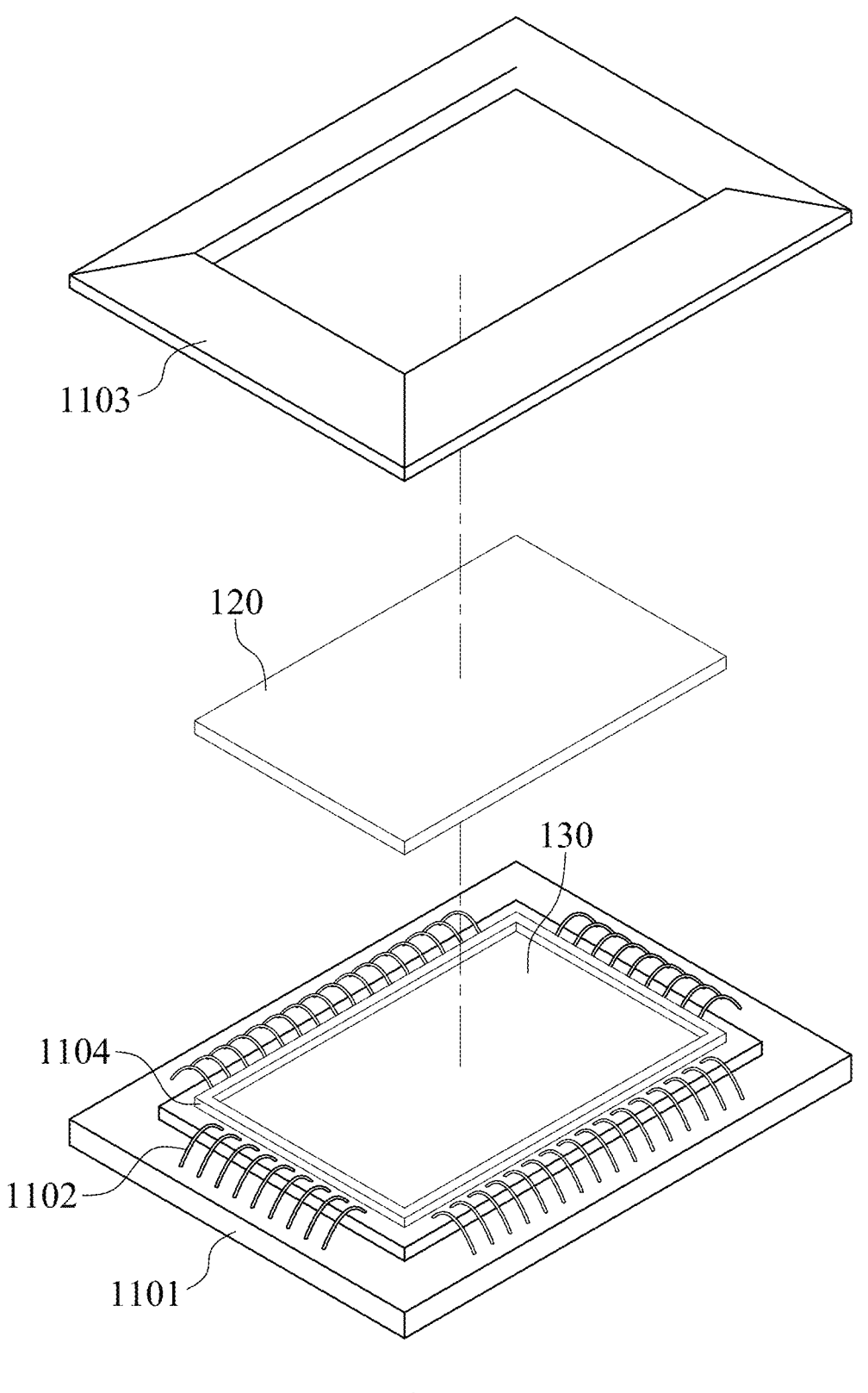
FIG. 1I is an exploded view of the image sensor according to the 1 st embodiment of FIG. 1A.

FIG. 1H is a three-dimensional schematic view of the image sensor 110 according to the 1st embodiment of FIG. 1A. FIG. 1I is an exploded view of the image sensor 110 according to the 1st embodiment of FIG. 1A. In FIG. 1A, FIG. 1H and FIG. 1I, the image sensor 110 can further include a plurality of conducting wires 1102, a sealing material 1103 and an adhesive 1104. The conducting wires 1102 connect the image sensor die 130 and the substrate 1101, the light transmitting element 120 is stacked above the image sensor die 130 via the adhesive 1104 so as to form the gap between the micro lens layer 132 of the image sensor die 130 and the light transmitting element 120. The sealing material 1103 is for package, which can embed the conducting wires 1102 and fill around the light transmitting element 120 so as to form an enclosed space between the light transmitting element 120 and the micro lens layer 132. Hence, it is favorable for avoiding the reflection of stray light by exposed conducting wires 1102, and also favorable for providing good sealability so as to enhance the reliability of the image sensor 110.

According to the 1st embodiment of FIG. 1A, when an average reflectance of each surface (the upper surface 121, the lower surface 122) with each anti-reflection coating 141, 142 corresponding to the light with the wavelength from 440 nm to 680 nm is $R_{4468}$, an average reflectance of each surface (the upper surface 121, the lower surface 122) with each anti-reflection coating 141, 142 corresponding to the light with the wavelength from 680 nm to 800 nm is $R_{6880}$, an average reflectance of each surface (the upper surface 121, the lower surface 122) with each anti-reflection coating 141, 142 corresponding to the light with the wavelength from 420 nm to 450 nm is $R_{4245}$, and an average reflectance of a surface (the surface of the micro lens layer 132) with the anti-reflection structure 150 corresponding to the light with the wavelength from 380 nm to 880 nm is $R_{3888}$, the following conditions are satisfied: $0.08\% \leq R_{4468} \leq 0.5\%$; $0.08\% \leq R_{6880} \leq 0.6\%$; $0.06\% \leq R_{4245} \leq 0.4\%$; and $0.01\% \leq R_{3888} \leq 0.3\%$.

Figure 1J:
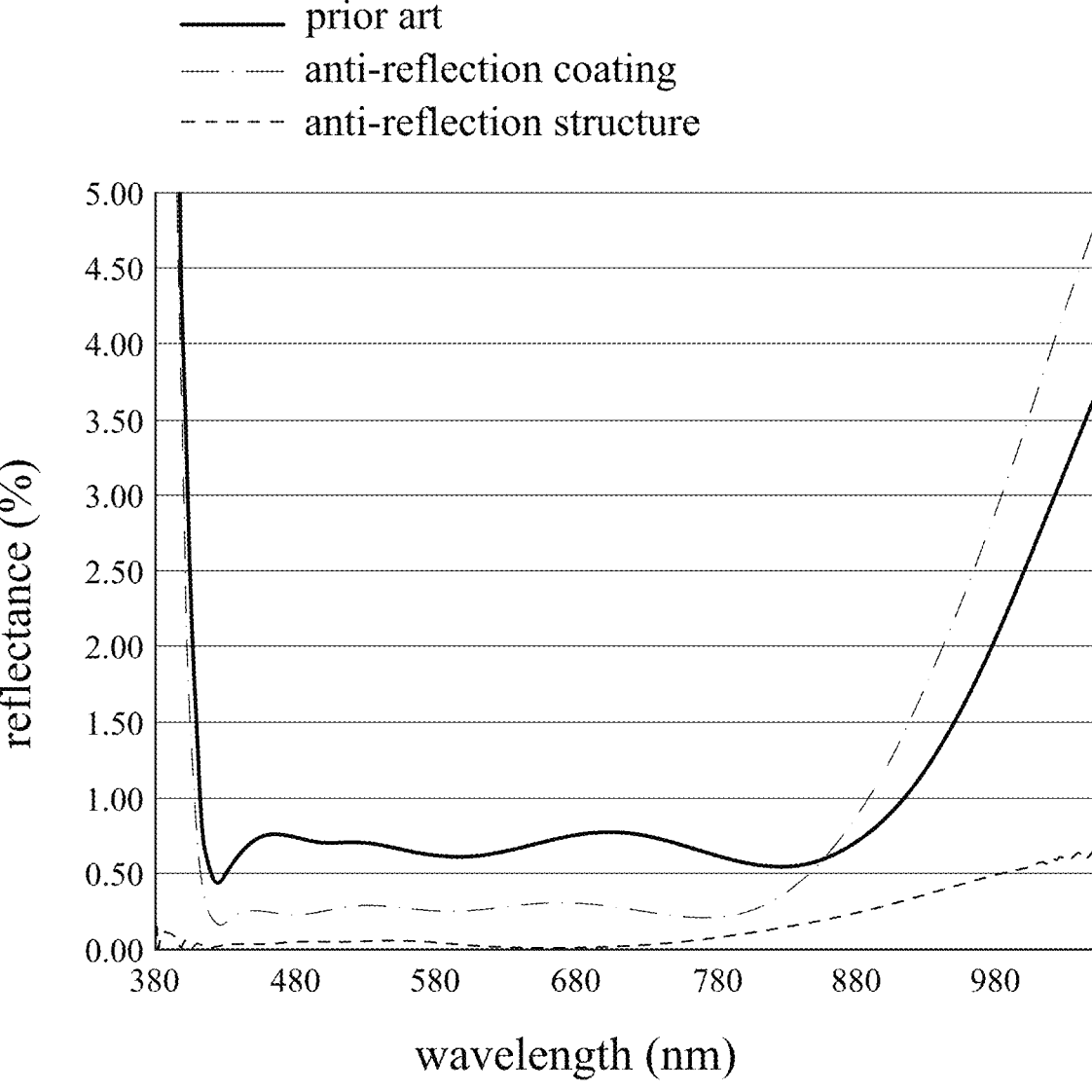
FIG. 1J shows a diagram of reflectance and wavelength of the anti-reflection coating of the image sensor in the prior art, the reflectance of the surface with the anti-reflection coating according to the 1 st embodiment, and the reflectance of the surface with the anti-reflection structure according to the 1st embodiment.

Please refer to Table 1A as below, which shows the reflectance of the anti-reflection coating of the image sensor in the prior art (which is prior art in Table 1A), the reflectance of the surface (the upper surface 121) with the anti-reflection coating 141 of the image sensor 110 according to the 1st embodiment (which is anti-reflection coating in Table 1A), and the reflectance of the surface (the surface of the micro lens layer 132) with the anti-reflection structure 150 of the image sensor 110 according to the 1 st embodiment (which is anti-reflection structure in Table 1A). Further, in FIG. 1J, which shows a diagram of reflectance and wavelength of the anti-reflection coating of the image sensor in the prior art (which is prior art in Table 1A), the reflectance of the surface with the anti-reflection coating 141 according to the 1st embodiment (which is anti-reflection coating in Table 1A), and the reflectance of the surface with the anti-reflection structure 150 according to the 1st embodiment (which is anti-reflection structure in Table 1A).

TABLE 1A

| wavelength (mm) | prior art (%) | anti-reflection coating (%) | anti-reflection structure (%) |
|---|---|---|---|
| 380 | 19.73 | 17.94 | 0.15 |
| 381 | 18.41 | 16.65 | 0.15 |
| 382 | 17.56 | 15.52 | 0.01 |
| 383 | 16.23 | 14.46 | 0.06 |
| 384 | 15.27 | 13.35 | 0.11 |
| 385 | 14.28 | 12.29 | 0.10 |
| 386 | 13.24 | 11.32 | 0.10 |
| 387 | 12.30 | 10.38 | 0.10 |
| 388 | 11.31 | 9.56 | 0.10 |
| 389 | 10.48 | 8.73 | 0.10 |
| 390 | 9.64 | 7.91 | 0.10 |
| 391 | 8.82 | 7.19 | 0.10 |
| 392 | 8.12 | 6.50 | 0.07 |
| 393 | 7.38 | 5.88 | 0.03 |
| 394 | 6.74 | 5.30 | 0.07 |
| 395 | 6.10 | 4.76 | 0.07 |
| 396 | 5.52 | 4.24 | 0.04 |
| 397 | 5.00 | 3.79 | 0.03 |
| 398 | 4.51 | 3.37 | 0.02 |
| 399 | 4.06 | 3.01 | 0.03 |
| 400 | 3.65 | 2.68 | 0.06 |
| 401 | 3.25 | 2.35 | 0.06 |
| 402 | 2.91 | 2.07 | 0.04 |
| 403 | 2.59 | 1.80 | 0.04 |
| 404 | 2.29 | 1.58 | 0.04 |
| 405 | 2.04 | 1.38 | 0.02 |
| 406 | 1.82 | 1.20 | 0.03 |
| 407 | 1.61 | 1.05 | 0.04 |
| 408 | 1.44 | 0.91 | 0.03 |
| 409 | 1.27 | 0.78 | 0.03 |
| 410 | 1.12 | 0.68 | 0.03 |
| 411 | 0.98 | 0.58 | 0.02 |
| 412 | 0.89 | 0.50 | 0.02 |
| 413 | 0.80 | 0.43 | 0.03 |
| 414 | 0.72 | 0.38 | 0.02 |
| 415 | 0.66 | 0.33 | 0.01 |
| 416 | 0.61 | 0.29 | 0.00 |
| 417 | 0.56 | 0.27 | 0.01 |
| 418 | 0.52 | 0.23 | 0.02 |
| 419 | 0.49 | 0.21 | 0.02 |
| 420 | 0.47 | 0.20 | 0.02 |
| 421 | 0.46 | 0.19 | 0.02 |
| 422 | 0.45 | 0.18 | 0.02 |
| 423 | 0.45 | 0.18 | 0.02 |
| 424 | 0.44 | 0.17 | 0.02 |
| 425 | 0.44 | 0.17 | 0.02 |
| 426 | 0.44 | 0.17 | 0.03 |
| 427 | 0.46 | 0.16 | 0.03 |
| 428 | 0.48 | 0.18 | 0.02 |
| 429 | 0.49 | 0.18 | 0.03 |
| 430 | 0.50 | 0.19 | 0.03 |
| 431 | 0.51 | 0.19 | 0.03 |
| 432 | 0.52 | 0.20 | 0.04 |
| 433 | 0.54 | 0.20 | 0.04 |
| 434 | 0.55 | 0.20 | 0.04 |
| 435 | 0.56 | 0.22 | 0.04 |
| 436 | 0.59 | 0.22 | 0.04 |
| 437 | 0.60 | 0.23 | 0.03 |
| 438 | 0.62 | 0.23 | 0.03 |
| 439 | 0.63 | 0.24 | 0.03 |
| 440 | 0.63 | 0.23 | 0.03 |
| 441 | 0.64 | 0.24 | 0.03 |
| 442 | 0.66 | 0.24 | 0.04 |
| 443 | 0.67 | 0.24 | 0.04 |
| 444 | 0.68 | 0.25 | 0.04 |
| 445 | 0.70 | 0.25 | 0.04 |
| 446 | 0.70 | 0.25 | 0.04 |
| 447 | 0.71 | 0.24 | 0.03 |
| 448 | 0.72 | 0.25 | 0.03 |
| 449 | 0.72 | 0.25 | 0.04 |

TABLE 1A-continued

| wavelength (mm) | prior art (%) | anti-reflection coating (%) | anti-reflection structure (%) |
|---|---|---|---|
| 450 | 0.73 | 0.25 | 0.04 |
| 451 | 0.74 | 0.25 | 0.03 |
| 452 | 0.74 | 0.25 | 0.03 |
| 453 | 0.74 | 0.26 | 0.04 |
| 454 | 0.75 | 0.25 | 0.04 |
| 455 | 0.75 | 0.25 | 0.04 |
| 456 | 0.74 | 0.24 | 0.04 |
| 457 | 0.74 | 0.24 | 0.04 |
| 458 | 0.75 | 0.24 | 0.04 |
| 459 | 0.76 | 0.24 | 0.04 |
| 460 | 0.75 | 0.25 | 0.04 |
| 461 | 0.76 | 0.24 | 0.04 |
| 462 | 0.75 | 0.24 | 0.04 |
| 463 | 0.75 | 0.23 | 0.04 |
| 464 | 0.75 | 0.24 | 0.04 |
| 465 | 0.75 | 0.23 | 0.04 |
| 466 | 0.75 | 0.23 | 0.04 |
| 467 | 0.75 | 0.24 | 0.04 |
| 468 | 0.75 | 0.23 | 0.04 |
| 469 | 0.74 | 0.23 | 0.04 |
| 470 | 0.74 | 0.23 | 0.04 |
| 471 | 0.73 | 0.23 | 0.04 |
| 472 | 0.73 | 0.23 | 0.04 |
| 473 | 0.73 | 0.23 | 0.04 |
| 474 | 0.73 | 0.23 | 0.04 |
| 475 | 0.73 | 0.22 | 0.04 |
| 476 | 0.73 | 0.23 | 0.04 |
| 477 | 0.73 | 0.23 | 0.04 |
| 478 | 0.73 | 0.23 | 0.05 |
| 479 | 0.72 | 0.22 | 0.04 |
| 480 | 0.72 | 0.23 | 0.05 |
| 481 | 0.72 | 0.23 | 0.05 |
| 482 | 0.72 | 0.23 | 0.05 |
| 483 | 0.72 | 0.23 | 0.05 |
| 484 | 0.72 | 0.23 | 0.05 |
| 485 | 0.72 | 0.23 | 0.05 |
| 486 | 0.71 | 0.23 | 0.05 |
| 487 | 0.71 | 0.23 | 0.05 |
| 488 | 0.71 | 0.23 | 0.05 |
| 489 | 0.71 | 0.24 | 0.05 |
| 490 | 0.71 | 0.24 | 0.05 |
| 491 | 0.71 | 0.23 | 0.05 |
| 492 | 0.71 | 0.24 | 0.05 |
| 493 | 0.71 | 0.24 | 0.05 |
| 494 | 0.71 | 0.24 | 0.05 |
| 495 | 0.71 | 0.24 | 0.05 |
| 496 | 0.71 | 0.25 | 0.05 |
| 497 | 0.71 | 0.25 | 0.05 |
| 498 | 0.71 | 0.25 | 0.05 |
| 499 | 0.71 | 0.25 | 0.05 |
| 500 | 0.71 | 0.25 | 0.05 |
| 501 | 0.71 | 0.25 | 0.05 |
| 502 | 0.71 | 0.26 | 0.05 |
| 503 | 0.71 | 0.26 | 0.05 |
| 504 | 0.71 | 0.26 | 0.05 |
| 505 | 0.71 | 0.26 | 0.05 |
| 506 | 0.71 | 0.27 | 0.05 |
| 507 | 0.71 | 0.27 | 0.05 |
| 508 | 0.71 | 0.27 | 0.05 |
| 509 | 0.71 | 0.27 | 0.05 |
| 510 | 0.71 | 0.27 | 0.05 |
| 511 | 0.71 | 0.27 | 0.05 |
| 512 | 0.71 | 0.27 | 0.05 |
| 513 | 0.71 | 0.28 | 0.05 |
| 514 | 0.72 | 0.28 | 0.05 |
| 515 | 0.71 | 0.28 | 0.05 |
| 516 | 0.71 | 0.28 | 0.05 |
| 517 | 0.71 | 0.28 | 0.05 |
| 518 | 0.71 | 0.28 | 0.05 |
| 519 | 0.71 | 0.28 | 0.05 |
| 520 | 0.71 | 0.28 | 0.05 |
| 521 | 0.71 | 0.29 | 0.05 |
| 522 | 0.71 | 0.29 | 0.05 |
| 523 | 0.71 | 0.29 | 0.05 |
| 524 | 0.71 | 0.29 | 0.05 |
| 525 | 0.71 | 0.29 | 0.05 |
| 526 | 0.71 | 0.29 | 0.05 |

TABLE 1A-continued

| wavelength (mm) | prior art (%) | anti-reflection coating (%) | anti-reflection structure (%) |
|---|---|---|---|
| 527 | 0.71 | 0.29 | 0.05 |
| 528 | 0.71 | 0.29 | 0.05 |
| 529 | 0.71 | 0.29 | 0.05 |
| 530 | 0.71 | 0.29 | 0.05 |
| 531 | 0.71 | 0.29 | 0.05 |
| 532 | 0.71 | 0.29 | 0.05 |
| 533 | 0.71 | 0.29 | 0.05 |
| 534 | 0.70 | 0.29 | 0.05 |
| 535 | 0.70 | 0.29 | 0.05 |
| 536 | 0.70 | 0.29 | 0.05 |
| 537 | 0.70 | 0.29 | 0.05 |
| 538 | 0.70 | 0.29 | 0.05 |
| 539 | 0.70 | 0.28 | 0.05 |
| 540 | 0.70 | 0.28 | 0.05 |
| 541 | 0.69 | 0.28 | 0.05 |
| 542 | 0.69 | 0.28 | 0.05 |
| 543 | 0.69 | 0.28 | 0.05 |
| 544 | 0.69 | 0.28 | 0.05 |
| 545 | 0.69 | 0.28 | 0.05 |
| 546 | 0.69 | 0.28 | 0.05 |
| 547 | 0.69 | 0.28 | 0.05 |
| 548 | 0.68 | 0.28 | 0.05 |
| 549 | 0.68 | 0.28 | 0.05 |
| 550 | 0.68 | 0.28 | 0.05 |
| 551 | 0.68 | 0.28 | 0.05 |
| 552 | 0.68 | 0.28 | 0.05 |
| 553 | 0.67 | 0.28 | 0.04 |
| 554 | 0.67 | 0.27 | 0.04 |
| 555 | 0.67 | 0.28 | 0.04 |
| 556 | 0.67 | 0.27 | 0.04 |
| 557 | 0.66 | 0.27 | 0.04 |
| 558 | 0.66 | 0.27 | 0.05 |
| 559 | 0.66 | 0.27 | 0.04 |
| 560 | 0.66 | 0.27 | 0.04 |
| 561 | 0.66 | 0.27 | 0.04 |
| 562 | 0.66 | 0.27 | 0.04 |
| 563 | 0.65 | 0.27 | 0.04 |
| 564 | 0.65 | 0.27 | 0.04 |
| 565 | 0.65 | 0.27 | 0.04 |
| 566 | 0.65 | 0.27 | 0.04 |
| 567 | 0.65 | 0.26 | 0.04 |
| 568 | 0.65 | 0.26 | 0.04 |
| 569 | 0.64 | 0.26 | 0.04 |
| 570 | 0.64 | 0.26 | 0.04 |
| 571 | 0.64 | 0.26 | 0.04 |
| 572 | 0.63 | 0.26 | 0.04 |
| 573 | 0.64 | 0.26 | 0.04 |
| 574 | 0.63 | 0.26 | 0.04 |
| 575 | 0.63 | 0.26 | 0.04 |
| 576 | 0.63 | 0.26 | 0.04 |
| 577 | 0.63 | 0.26 | 0.04 |
| 578 | 0.63 | 0.26 | 0.04 |
| 579 | 0.62 | 0.26 | 0.04 |
| 580 | 0.62 | 0.25 | 0.04 |
| 581 | 0.62 | 0.26 | 0.04 |
| 582 | 0.62 | 0.26 | 0.03 |
| 583 | 0.62 | 0.25 | 0.03 |
| 584 | 0.62 | 0.25 | 0.03 |
| 585 | 0.62 | 0.25 | 0.03 |
| 586 | 0.61 | 0.25 | 0.03 |
| 587 | 0.61 | 0.25 | 0.03 |
| 588 | 0.61 | 0.25 | 0.03 |
| 589 | 0.61 | 0.25 | 0.03 |
| 590 | 0.61 | 0.25 | 0.03 |
| 591 | 0.61 | 0.25 | 0.03 |
| 592 | 0.61 | 0.25 | 0.03 |
| 593 | 0.61 | 0.25 | 0.03 |
| 594 | 0.61 | 0.25 | 0.03 |
| 595 | 0.61 | 0.25 | 0.03 |
| 596 | 0.61 | 0.25 | 0.03 |
| 597 | 0.61 | 0.25 | 0.03 |
| 598 | 0.61 | 0.25 | 0.03 |
| 599 | 0.61 | 0.26 | 0.03 |
| 600 | 0.61 | 0.25 | 0.03 |
| 601 | 0.61 | 0.25 | 0.03 |
| 602 | 0.61 | 0.25 | 0.03 |
| 603 | 0.61 | 0.26 | 0.03 |

TABLE 1A-continued

| wavelength (mm) | prior art (%) | anti-reflection coating (%) | anti-reflection structure (%) |
|---|---|---|---|
| 604 | 0.61 | 0.26 | 0.03 |
| 605 | 0.61 | 0.26 | 0.03 |
| 606 | 0.61 | 0.26 | 0.03 |
| 607 | 0.61 | 0.26 | 0.03 |
| 608 | 0.61 | 0.26 | 0.03 |
| 609 | 0.61 | 0.26 | 0.03 |
| 610 | 0.61 | 0.26 | 0.03 |
| 611 | 0.61 | 0.26 | 0.03 |
| 612 | 0.62 | 0.26 | 0.03 |
| 613 | 0.62 | 0.26 | 0.03 |
| 614 | 0.62 | 0.26 | 0.02 |
| 615 | 0.62 | 0.26 | 0.02 |
| 616 | 0.62 | 0.27 | 0.03 |
| 617 | 0.62 | 0.26 | 0.02 |
| 618 | 0.62 | 0.27 | 0.02 |
| 619 | 0.63 | 0.27 | 0.02 |
| 620 | 0.63 | 0.27 | 0.02 |
| 621 | 0.63 | 0.27 | 0.02 |
| 622 | 0.63 | 0.27 | 0.02 |
| 623 | 0.63 | 0.27 | 0.02 |
| 624 | 0.63 | 0.27 | 0.02 |
| 625 | 0.63 | 0.27 | 0.02 |
| 626 | 0.64 | 0.27 | 0.02 |
| 627 | 0.64 | 0.28 | 0.02 |
| 628 | 0.64 | 0.28 | 0.02 |
| 629 | 0.64 | 0.28 | 0.02 |
| 630 | 0.64 | 0.28 | 0.02 |
| 631 | 0.64 | 0.28 | 0.02 |
| 632 | 0.65 | 0.28 | 0.02 |
| 633 | 0.65 | 0.28 | 0.02 |
| 634 | 0.65 | 0.28 | 0.02 |
| 635 | 0.66 | 0.29 | 0.02 |
| 636 | 0.66 | 0.29 | 0.02 |
| 637 | 0.66 | 0.29 | 0.02 |
| 638 | 0.66 | 0.29 | 0.02 |
| 639 | 0.66 | 0.29 | 0.02 |
| 640 | 0.67 | 0.29 | 0.02 |
| 641 | 0.67 | 0.29 | 0.02 |
| 642 | 0.67 | 0.29 | 0.02 |
| 643 | 0.67 | 0.29 | 0.02 |
| 644 | 0.68 | 0.29 | 0.02 |
| 645 | 0.68 | 0.29 | 0.01 |
| 646 | 0.68 | 0.30 | 0.02 |
| 647 | 0.68 | 0.30 | 0.02 |
| 648 | 0.69 | 0.30 | 0.02 |
| 649 | 0.69 | 0.30 | 0.01 |
| 650 | 0.69 | 0.30 | 0.01 |
| 651 | 0.69 | 0.30 | 0.01 |
| 652 | 0.70 | 0.30 | 0.01 |
| 653 | 0.70 | 0.30 | 0.01 |
| 654 | 0.70 | 0.30 | 0.01 |
| 655 | 0.70 | 0.30 | 0.01 |
| 656 | 0.70 | 0.30 | 0.01 |
| 657 | 0.71 | 0.30 | 0.01 |
| 658 | 0.71 | 0.30 | 0.01 |
| 659 | 0.71 | 0.31 | 0.01 |
| 660 | 0.72 | 0.31 | 0.01 |
| 661 | 0.72 | 0.30 | 0.01 |
| 662 | 0.72 | 0.30 | 0.01 |
| 663 | 0.72 | 0.31 | 0.01 |
| 664 | 0.72 | 0.31 | 0.01 |
| 665 | 0.73 | 0.31 | 0.01 |
| 666 | 0.73 | 0.31 | 0.01 |
| 667 | 0.73 | 0.31 | 0.01 |
| 668 | 0.73 | 0.31 | 0.01 |
| 669 | 0.73 | 0.31 | 0.01 |
| 670 | 0.74 | 0.31 | 0.01 |
| 671 | 0.74 | 0.31 | 0.01 |
| 672 | 0.74 | 0.31 | 0.01 |
| 673 | 0.74 | 0.31 | 0.01 |
| 674 | 0.74 | 0.31 | 0.01 |
| 675 | 0.75 | 0.31 | 0.01 |
| 676 | 0.75 | 0.31 | 0.01 |
| 677 | 0.75 | 0.31 | 0.01 |
| 678 | 0.75 | 0.31 | 0.01 |
| 679 | 0.75 | 0.30 | 0.01 |
| 680 | 0.75 | 0.31 | 0.01 |

TABLE 1A-continued

| wavelength (mm) | prior art (%) | anti-reflection coating (%) | anti-reflection structure (%) |
|---|---|---|---|
| 681 | 0.76 | 0.31 | 0.01 |
| 682 | 0.76 | 0.31 | 0.01 |
| 683 | 0.76 | 0.31 | 0.01 |
| 684 | 0.76 | 0.30 | 0.01 |
| 685 | 0.76 | 0.30 | 0.01 |
| 686 | 0.76 | 0.30 | 0.01 |
| 687 | 0.76 | 0.30 | 0.01 |
| 688 | 0.77 | 0.30 | 0.02 |
| 689 | 0.77 | 0.30 | 0.02 |
| 690 | 0.77 | 0.30 | 0.02 |
| 691 | 0.77 | 0.30 | 0.02 |
| 692 | 0.77 | 0.30 | 0.02 |
| 693 | 0.77 | 0.30 | 0.02 |
| 694 | 0.77 | 0.30 | 0.02 |
| 695 | 0.77 | 0.30 | 0.02 |
| 696 | 0.77 | 0.30 | 0.02 |
| 697 | 0.77 | 0.30 | 0.02 |
| 698 | 0.77 | 0.29 | 0.02 |
| 699 | 0.77 | 0.29 | 0.02 |
| 700 | 0.77 | 0.29 | 0.02 |
| 701 | 0.77 | 0.29 | 0.02 |
| 702 | 0.77 | 0.29 | 0.02 |
| 703 | 0.77 | 0.29 | 0.02 |
| 704 | 0.77 | 0.29 | 0.02 |
| 705 | 0.77 | 0.29 | 0.02 |
| 706 | 0.77 | 0.28 | 0.02 |
| 707 | 0.77 | 0.28 | 0.02 |
| 708 | 0.77 | 0.28 | 0.02 |
| 709 | 0.77 | 0.28 | 0.02 |
| 710 | 0.77 | 0.28 | 0.02 |
| 711 | 0.77 | 0.28 | 0.02 |
| 712 | 0.77 | 0.28 | 0.02 |
| 713 | 0.77 | 0.28 | 0.02 |
| 714 | 0.77 | 0.27 | 0.02 |
| 715 | 0.77 | 0.27 | 0.02 |
| 716 | 0.77 | 0.27 | 0.02 |
| 717 | 0.76 | 0.27 | 0.02 |
| 718 | 0.76 | 0.27 | 0.02 |
| 719 | 0.76 | 0.27 | 0.02 |
| 720 | 0.76 | 0.27 | 0.03 |
| 721 | 0.76 | 0.26 | 0.03 |
| 722 | 0.76 | 0.26 | 0.03 |
| 723 | 0.76 | 0.26 | 0.03 |
| 724 | 0.76 | 0.26 | 0.03 |
| 725 | 0.75 | 0.26 | 0.03 |
| 726 | 0.76 | 0.26 | 0.03 |
| 727 | 0.75 | 0.26 | 0.03 |
| 728 | 0.75 | 0.25 | 0.03 |
| 729 | 0.75 | 0.25 | 0.03 |
| 730 | 0.75 | 0.25 | 0.03 |
| 731 | 0.75 | 0.25 | 0.03 |
| 732 | 0.74 | 0.25 | 0.03 |
| 733 | 0.74 | 0.24 | 0.03 |
| 734 | 0.74 | 0.25 | 0.03 |
| 735 | 0.74 | 0.24 | 0.03 |
| 736 | 0.74 | 0.24 | 0.04 |
| 737 | 0.73 | 0.24 | 0.04 |
| 738 | 0.73 | 0.24 | 0.04 |
| 739 | 0.73 | 0.24 | 0.04 |
| 740 | 0.73 | 0.24 | 0.04 |
| 741 | 0.73 | 0.24 | 0.04 |
| 742 | 0.72 | 0.23 | 0.04 |
| 743 | 0.72 | 0.23 | 0.04 |
| 744 | 0.72 | 0.23 | 0.04 |
| 745 | 0.72 | 0.23 | 0.04 |
| 746 | 0.71 | 0.23 | 0.04 |
| 747 | 0.71 | 0.23 | 0.04 |
| 748 | 0.71 | 0.22 | 0.05 |
| 749 | 0.71 | 0.22 | 0.05 |
| 750 | 0.71 | 0.23 | 0.05 |
| 751 | 0.70 | 0.22 | 0.05 |
| 752 | 0.70 | 0.22 | 0.05 |
| 753 | 0.69 | 0.22 | 0.05 |
| 754 | 0.69 | 0.22 | 0.05 |
| 755 | 0.69 | 0.22 | 0.05 |
| 756 | 0.69 | 0.22 | 0.05 |
| 757 | 0.69 | 0.22 | 0.05 |

TABLE 1A-continued

| wavelength (mm) | prior art (%) | anti-reflection coating (%) | anti-reflection structure (%) |
|---|---|---|---|
| 758 | 0.68 | 0.22 | 0.05 |
| 759 | 0.68 | 0.22 | 0.05 |
| 760 | 0.68 | 0.22 | 0.05 |
| 761 | 0.67 | 0.21 | 0.05 |
| 762 | 0.67 | 0.21 | 0.05 |
| 763 | 0.67 | 0.21 | 0.06 |
| 764 | 0.67 | 0.21 | 0.06 |
| 765 | 0.66 | 0.21 | 0.06 |
| 766 | 0.66 | 0.21 | 0.06 |
| 767 | 0.66 | 0.21 | 0.06 |
| 768 | 0.65 | 0.21 | 0.06 |
| 769 | 0.65 | 0.21 | 0.06 |
| 770 | 0.65 | 0.21 | 0.06 |
| 771 | 0.64 | 0.21 | 0.06 |
| 772 | 0.64 | 0.21 | 0.07 |
| 773 | 0.64 | 0.21 | 0.07 |
| 774 | 0.64 | 0.21 | 0.07 |
| 775 | 0.64 | 0.21 | 0.07 |
| 776 | 0.63 | 0.21 | 0.07 |
| 777 | 0.63 | 0.21 | 0.07 |
| 778 | 0.63 | 0.21 | 0.07 |
| 779 | 0.62 | 0.21 | 0.07 |
| 780 | 0.62 | 0.22 | 0.08 |
| 781 | 0.62 | 0.22 | 0.08 |
| 782 | 0.61 | 0.22 | 0.08 |
| 783 | 0.61 | 0.22 | 0.08 |
| 784 | 0.61 | 0.22 | 0.08 |
| 785 | 0.61 | 0.22 | 0.08 |
| 786 | 0.60 | 0.22 | 0.08 |
| 787 | 0.60 | 0.22 | 0.08 |
| 788 | 0.60 | 0.23 | 0.08 |
| 789 | 0.60 | 0.23 | 0.09 |
| 790 | 0.59 | 0.23 | 0.09 |
| 791 | 0.59 | 0.23 | 0.09 |
| 792 | 0.59 | 0.23 | 0.09 |
| 793 | 0.58 | 0.23 | 0.09 |
| 794 | 0.58 | 0.24 | 0.09 |
| 795 | 0.58 | 0.24 | 0.10 |
| 796 | 0.58 | 0.24 | 0.10 |
| 797 | 0.58 | 0.24 | 0.10 |
| 798 | 0.57 | 0.25 | 0.10 |
| 799 | 0.57 | 0.25 | 0.10 |
| 800 | 0.57 | 0.25 | 0.10 |
| 801 | 0.57 | 0.25 | 0.11 |
| 802 | 0.56 | 0.25 | 0.11 |
| 803 | 0.56 | 0.26 | 0.11 |
| 804 | 0.56 | 0.26 | 0.11 |
| 805 | 0.56 | 0.26 | 0.11 |
| 806 | 0.56 | 0.27 | 0.11 |
| 807 | 0.56 | 0.27 | 0.11 |
| 808 | 0.55 | 0.27 | 0.12 |
| 809 | 0.55 | 0.28 | 0.12 |
| 810 | 0.55 | 0.28 | 0.12 |
| 811 | 0.55 | 0.29 | 0.12 |
| 812 | 0.55 | 0.29 | 0.12 |
| 813 | 0.55 | 0.30 | 0.12 |
| 814 | 0.55 | 0.30 | 0.12 |
| 815 | 0.54 | 0.30 | 0.13 |
| 816 | 0.54 | 0.31 | 0.13 |
| 817 | 0.54 | 0.31 | 0.13 |
| 818 | 0.54 | 0.32 | 0.13 |
| 819 | 0.54 | 0.32 | 0.13 |
| 820 | 0.54 | 0.33 | 0.13 |
| 821 | 0.54 | 0.33 | 0.14 |
| 822 | 0.54 | 0.34 | 0.14 |
| 823 | 0.54 | 0.34 | 0.14 |
| 824 | 0.54 | 0.35 | 0.14 |
| 825 | 0.54 | 0.35 | 0.14 |
| 826 | 0.54 | 0.36 | 0.14 |
| 827 | 0.54 | 0.37 | 0.15 |
| 828 | 0.54 | 0.37 | 0.15 |
| 829 | 0.54 | 0.38 | 0.15 |
| 830 | 0.54 | 0.38 | 0.15 |
| 831 | 0.54 | 0.39 | 0.15 |
| 832 | 0.54 | 0.40 | 0.15 |
| 833 | 0.54 | 0.40 | 0.16 |
| 834 | 0.54 | 0.41 | 0.16 |

TABLE 1A-continued

| wavelength (mm) | prior art (%) | anti-reflection coating (%) | anti-reflection structure (%) |
|---|---|---|---|
| 835 | 0.54 | 0.42 | 0.16 |
| 836 | 0.54 | 0.43 | 0.16 |
| 837 | 0.55 | 0.43 | 0.16 |
| 838 | 0.55 | 0.44 | 0.16 |
| 839 | 0.54 | 0.45 | 0.17 |
| 840 | 0.55 | 0.46 | 0.17 |
| 841 | 0.55 | 0.46 | 0.17 |
| 842 | 0.55 | 0.47 | 0.17 |
| 843 | 0.55 | 0.48 | 0.17 |
| 844 | 0.55 | 0.49 | 0.17 |
| 845 | 0.56 | 0.50 | 0.18 |
| 846 | 0.56 | 0.51 | 0.18 |
| 847 | 0.56 | 0.52 | 0.18 |
| 848 | 0.56 | 0.52 | 0.18 |
| 849 | 0.56 | 0.53 | 0.19 |
| 850 | 0.57 | 0.54 | 0.19 |
| 851 | 0.57 | 0.55 | 0.19 |
| 852 | 0.57 | 0.56 | 0.19 |
| 853 | 0.57 | 0.57 | 0.19 |
| 854 | 0.58 | 0.58 | 0.19 |
| 855 | 0.58 | 0.59 | 0.20 |
| 856 | 0.58 | 0.60 | 0.20 |
| 857 | 0.59 | 0.61 | 0.20 |
| 858 | 0.59 | 0.62 | 0.20 |
| 859 | 0.59 | 0.63 | 0.20 |
| 860 | 0.60 | 0.64 | 0.21 |
| 861 | 0.60 | 0.65 | 0.21 |
| 862 | 0.60 | 0.66 | 0.21 |
| 863 | 0.61 | 0.67 | 0.21 |
| 864 | 0.61 | 0.68 | 0.21 |
| 865 | 0.62 | 0.70 | 0.22 |
| 866 | 0.63 | 0.71 | 0.22 |
| 867 | 0.63 | 0.72 | 0.22 |
| 868 | 0.63 | 0.73 | 0.22 |
| 869 | 0.64 | 0.74 | 0.22 |
| 870 | 0.64 | 0.76 | 0.23 |
| 871 | 0.65 | 0.77 | 0.23 |
| 872 | 0.65 | 0.78 | 0.23 |
| 873 | 0.66 | 0.79 | 0.23 |
| 874 | 0.67 | 0.81 | 0.23 |
| 875 | 0.67 | 0.82 | 0.24 |
| 876 | 0.68 | 0.83 | 0.24 |
| 877 | 0.68 | 0.84 | 0.24 |
| 878 | 0.69 | 0.86 | 0.24 |
| 879 | 0.70 | 0.87 | 0.24 |
| 880 | 0.70 | 0.88 | 0.25 |
| 881 | 0.71 | 0.90 | 0.25 |
| 882 | 0.71 | 0.91 | 0.25 |
| 883 | 0.72 | 0.93 | 0.25 |
| 884 | 0.73 | 0.94 | 0.26 |
| 885 | 0.73 | 0.96 | 0.26 |
| 886 | 0.74 | 0.97 | 0.26 |
| 887 | 0.75 | 0.98 | 0.26 |
| 888 | 0.76 | 1.00 | 0.26 |
| 889 | 0.77 | 1.02 | 0.27 |
| 890 | 0.77 | 1.03 | 0.27 |
| 891 | 0.78 | 1.05 | 0.27 |
| 892 | 0.79 | 1.06 | 0.27 |
| 893 | 0.80 | 1.08 | 0.28 |
| 894 | 0.81 | 1.09 | 0.28 |
| 895 | 0.81 | 1.11 | 0.28 |
| 896 | 0.82 | 1.13 | 0.28 |
| 897 | 0.83 | 1.14 | 0.29 |
| 898 | 0.84 | 1.16 | 0.29 |
| 899 | 0.85 | 1.17 | 0.29 |
| 900 | 0.86 | 1.19 | 0.29 |
| 901 | 0.87 | 1.20 | 0.29 |
| 902 | 0.88 | 1.22 | 0.30 |
| 903 | 0.89 | 1.24 | 0.30 |
| 904 | 0.90 | 1.26 | 0.30 |
| 905 | 0.91 | 1.28 | 0.30 |
| 906 | 0.92 | 1.29 | 0.31 |
| 907 | 0.93 | 1.31 | 0.31 |
| 908 | 0.94 | 1.33 | 0.31 |
| 909 | 0.95 | 1.34 | 0.31 |
| 910 | 0.96 | 1.36 | 0.31 |
| 911 | 0.97 | 1.38 | 0.32 |

TABLE 1A-continued

| wavelength (mm) | prior art (%) | anti-reflection coating (%) | anti-reflection structure (%) |
|---|---|---|---|
| 912 | 0.99 | 1.40 | 0.31 |
| 913 | 1.00 | 1.42 | 0.32 |
| 914 | 1.01 | 1.44 | 0.32 |
| 915 | 1.02 | 1.45 | 0.33 |
| 916 | 1.03 | 1.47 | 0.33 |
| 917 | 1.04 | 1.49 | 0.33 |
| 918 | 1.05 | 1.51 | 0.33 |
| 919 | 1.07 | 1.53 | 0.33 |
| 920 | 1.08 | 1.55 | 0.34 |
| 921 | 1.09 | 1.57 | 0.34 |
| 922 | 1.11 | 1.59 | 0.34 |
| 923 | 1.12 | 1.61 | 0.35 |
| 924 | 1.13 | 1.63 | 0.35 |
| 925 | 1.14 | 1.65 | 0.35 |
| 926 | 1.16 | 1.67 | 0.35 |
| 927 | 1.17 | 1.69 | 0.36 |
| 928 | 1.18 | 1.71 | 0.36 |
| 929 | 1.20 | 1.73 | 0.36 |
| 930 | 1.21 | 1.75 | 0.36 |
| 931 | 1.23 | 1.77 | 0.36 |
| 932 | 1.24 | 1.79 | 0.37 |
| 933 | 1.25 | 1.81 | 0.37 |
| 934 | 1.27 | 1.83 | 0.37 |
| 935 | 1.28 | 1.86 | 0.38 |
| 936 | 1.30 | 1.88 | 0.38 |
| 937 | 1.31 | 1.90 | 0.38 |
| 938 | 1.33 | 1.92 | 0.38 |
| 939 | 1.34 | 1.94 | 0.39 |
| 940 | 1.35 | 1.96 | 0.39 |
| 941 | 1.37 | 1.98 | 0.39 |
| 942 | 1.39 | 2.01 | 0.39 |
| 943 | 1.41 | 2.03 | 0.39 |
| 944 | 1.42 | 2.06 | 0.40 |
| 945 | 1.44 | 2.07 | 0.40 |
| 946 | 1.45 | 2.10 | 0.40 |
| 947 | 1.47 | 2.12 | 0.40 |
| 948 | 1.48 | 2.14 | 0.40 |
| 949 | 1.50 | 2.16 | 0.41 |
| 950 | 1.52 | 2.19 | 0.41 |
| 951 | 1.53 | 2.21 | 0.41 |
| 952 | 1.55 | 2.23 | 0.42 |
| 953 | 1.57 | 2.26 | 0.42 |
| 954 | 1.58 | 2.28 | 0.42 |
| 955 | 1.60 | 2.30 | 0.43 |
| 956 | 1.62 | 2.33 | 0.43 |
| 957 | 1.64 | 2.36 | 0.43 |
| 958 | 1.66 | 2.38 | 0.44 |
| 959 | 1.67 | 2.40 | 0.44 |
| 960 | 1.69 | 2.43 | 0.44 |
| 961 | 1.71 | 2.45 | 0.44 |
| 962 | 1.72 | 2.48 | 0.44 |
| 963 | 1.74 | 2.50 | 0.45 |
| 964 | 1.76 | 2.52 | 0.45 |
| 965 | 1.78 | 2.55 | 0.45 |
| 966 | 1.80 | 2.58 | 0.46 |
| 967 | 1.82 | 2.60 | 0.46 |
| 968 | 1.84 | 2.62 | 0.46 |
| 969 | 1.86 | 2.65 | 0.47 |
| 970 | 1.88 | 2.67 | 0.46 |
| 971 | 1.89 | 2.70 | 0.46 |
| 972 | 1.91 | 2.72 | 0.47 |
| 973 | 1.93 | 2.75 | 0.47 |
| 974 | 1.96 | 2.78 | 0.48 |
| 975 | 1.97 | 2.80 | 0.48 |
| 976 | 2.00 | 2.83 | 0.49 |
| 977 | 2.02 | 2.85 | 0.49 |
| 978 | 2.03 | 2.88 | 0.49 |
| 979 | 2.06 | 2.90 | 0.49 |
| 980 | 2.07 | 2.93 | 0.50 |
| 981 | 2.10 | 2.96 | 0.49 |
| 982 | 2.12 | 2.98 | 0.49 |
| 983 | 2.13 | 3.01 | 0.49 |
| 984 | 2.16 | 3.03 | 0.50 |
| 985 | 2.18 | 3.06 | 0.50 |
| 986 | 2.20 | 3.08 | 0.51 |
| 987 | 2.22 | 3.11 | 0.51 |
| 988 | 2.24 | 3.14 | 0.51 |

TABLE 1A-continued

| wavelength (mm) | prior art (%) | anti-reflection coating (%) | anti-reflection structure (%) |
|---|---|---|---|
| 989 | 2.26 | 3.17 | 0.51 |
| 990 | 2.28 | 3.20 | 0.52 |
| 991 | 2.31 | 3.22 | 0.52 |
| 992 | 2.33 | 3.24 | 0.52 |
| 993 | 2.35 | 3.27 | 0.52 |
| 994 | 2.37 | 3.30 | 0.52 |
| 995 | 2.39 | 3.32 | 0.53 |
| 996 | 2.41 | 3.36 | 0.53 |
| 997 | 2.44 | 3.38 | 0.53 |
| 998 | 2.46 | 3.41 | 0.54 |
| 999 | 2.48 | 3.44 | 0.54 |
| 1000 | 2.50 | 3.46 | 0.53 |
| 1001 | 2.52 | 3.49 | 0.53 |
| 1002 | 2.54 | 3.51 | 0.55 |
| 1003 | 2.57 | 3.54 | 0.55 |
| 1004 | 2.59 | 3.57 | 0.54 |
| 1005 | 2.62 | 3.60 | 0.55 |
| 1006 | 2.64 | 3.63 | 0.55 |
| 1007 | 2.66 | 3.65 | 0.54 |
| 1008 | 2.68 | 3.68 | 0.54 |
| 1009 | 2.70 | 3.70 | 0.56 |
| 1010 | 2.73 | 3.74 | 0.57 |
| 1011 | 2.75 | 3.76 | 0.57 |
| 1012 | 2.77 | 3.79 | 0.58 |
| 1013 | 2.80 | 3.82 | 0.58 |
| 1014 | 2.82 | 3.84 | 0.58 |
| 1015 | 2.85 | 3.87 | 0.56 |
| 1016 | 2.87 | 3.90 | 0.58 |
| 1017 | 2.88 | 3.92 | 0.60 |
| 1018 | 2.91 | 3.95 | 0.60 |
| 1019 | 2.93 | 3.98 | 0.61 |
| 1020 | 2.96 | 4.01 | 0.61 |
| 1021 | 2.99 | 4.04 | 0.60 |
| 1022 | 3.00 | 4.06 | 0.59 |
| 1023 | 3.03 | 4.09 | 0.61 |
| 1024 | 3.05 | 4.12 | 0.61 |
| 1025 | 3.07 | 4.14 | 0.60 |
| 1026 | 3.10 | 4.17 | 0.61 |
| 1027 | 3.13 | 4.21 | 0.60 |
| 1028 | 3.15 | 4.24 | 0.59 |
| 1029 | 3.17 | 4.26 | 0.60 |
| 1030 | 3.19 | 4.27 | 0.60 |
| 1031 | 3.22 | 4.31 | 0.61 |
| 1032 | 3.25 | 4.33 | 0.62 |
| 1033 | 3.26 | 4.36 | 0.61 |
| 1034 | 3.29 | 4.40 | 0.61 |
| 1035 | 3.32 | 4.42 | 0.63 |
| 1036 | 3.34 | 4.46 | 0.63 |
| 1037 | 3.36 | 4.48 | 0.63 |
| 1038 | 3.38 | 4.50 | 0.64 |
| 1039 | 3.42 | 4.52 | 0.63 |
| 1040 | 3.43 | 4.56 | 0.58 |
| 1041 | 3.44 | 4.58 | 0.60 |
| 1042 | 3.47 | 4.61 | 0.62 |
| 1043 | 3.48 | 4.64 | 0.60 |
| 1044 | 3.54 | 4.66 | 0.63 |
| 1045 | 3.55 | 4.69 | 0.63 |
| 1046 | 3.58 | 4.70 | 0.62 |
| 1047 | 3.61 | 4.73 | 0.64 |
| 1048 | 3.60 | 4.77 | 0.65 |
| 1049 | 3.64 | 4.80 | 0.65 |
| 1050 | 3.66 | 4.83 | 0.63 |

Please refer to Table 1B, which shows the average reflectances in specific ranges of wavelength (440 nm-680 nm, 680 nm-800 nm, 420 nm-450 nm, 380 nm-880 nm) from Table 1A.

TABLE 1B

| average reflectance | prior art (%) | anti-reflection coating (%) | anti-reflection structure (%) |
|---|---|---|---|
| 440 nm-680 nm | 0.68 | 0.27 | 0.04 |
| 680 nm-800 nm | 0.70 | 0.25 | 0.04 |

TABLE 1B-continued

| average reflectance | prior art (%) | anti-reflection coating (%) | anti-reflection structure (%) |
|---|---|---|---|
| 420 nm-450 nm | 0.57 | 0.21 | 0.03 |
| 380 nm-880 nm | 1.10 | 0.68 | 0.06 |

According to Table 1B, in the 1 st embodiment, the average reflectance of the surface (the upper surface 121) with the anti-reflection coating 141 corresponding to the light with the wavelength from 440 nm to 680 nm being $R_{4468}$ is 0.27%, the average reflectance of the surface (the upper surface 121) with the anti-reflection coating 141 corresponding to the light with the wavelength from 680 nm to 800 nm being $R_{6880}$ is 0.25%, the average reflectance of the surface (the upper surface 121) with the anti-reflection coating 141 corresponding to the light with the wavelength from 420 nm to 450 nm being $R_{4245}$ is 0.21%, and the average reflectance of the surface (the surface of the micro lens layer 132) with the anti-reflection structure 150 corresponding to the light with the wavelength from 380 nm to 880 nm being $R_{3888}$ is 0.06%. Furthermore, the average reflectance of the surface (the lower surface 122) with the anti-reflection coating 142 corresponding to the light with each foregoing range of wavelength can be the same value, and will not be mentioned again herein.

2nd Embodiment

Figure 2A:
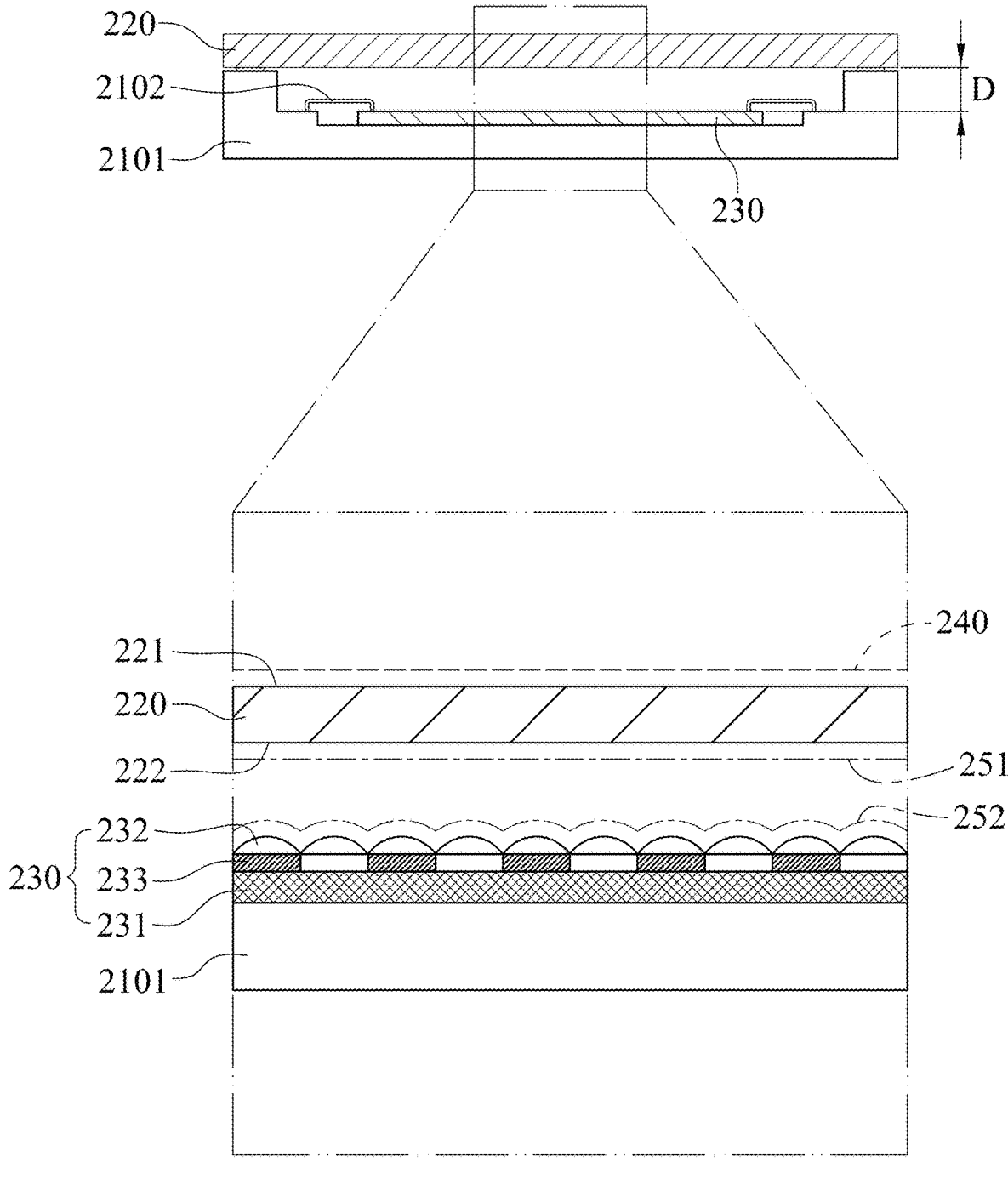
FIG. 2A is a schematic view of an image sensor according to the 2nd embodiment of the present disclosure.

FIG. 2A is a schematic view of an image sensor 210 according to the 2nd embodiment of the present disclosure, wherein the image sensor 210 in FIG. 2A can be applied to the imaging lens assembly module 100 as the image sensor 110 shown in FIG. 1A, but the structure and formation of the imaging lens assembly module will not be limited thereto. In FIG. 2A, the image sensor 210 includes an image sensor die 230, a light transmitting element 220, an anti-reflection coating 240 and two anti-reflection structures 251, 252. According to the 2nd embodiment, the anti-reflection coating 240, the light transmitting element 220, the anti-reflection structure 251, the anti-reflection structure 252 and the image sensor die 230 are disposed in order from an object side to an image side of the imaging lens assembly module (not shown) which is applied, and the image sensor die 230 is disposed on a substrate 2101, but the present disclosure will not be limited to the aforementioned arrangement.

The image sensor die 230 includes a photoelectric conversion layer 231, a filter layer 233 and a micro lens layer 232, wherein the photoelectric conversion layer 231 is for converting a light into an electronic signal, which is disposed on the substrate 2101, and the micro lens layer 232 is disposed above the photoelectric conversion layer 231 for converging the light onto the photoelectric conversion layer 231. The filter layer 233, which is disposed between the photoelectric conversion layer 231 and the micro lens layer 232, and is arranged in array corresponding to the micro lens layer 232. The detail of the photoelectric conversion layer 231, the filter layer 233 and the micro lens layer 232 can be the same with the description in the 1st embodiment, and will not be described again herein.

The light transmitting element 220 is disposed above the micro lens layer 232, and there is a gap formed between the light transmitting element 220 and the micro lens layer 232 (in the 2nd embodiment, a distance of the gap between the light transmitting element 220 and the micro lens layer 232 is D, D=0.1 mm). The light passes through the light transmitting element 220 and incidents into the image sensor 210. The light transmitting element 220 includes a lower surface 222 and an upper surface 221, wherein the lower surface 222 is disposed corresponding to the micro lens layer 232, and the upper surface 221 is disposed relative to the lower surface 222. The material of the light transmitting element 220 includes a light absorbing material, which can be glass material or plastic material, but will not be limited thereto. Specifically, the light absorbing material can be configured on demand, so that the light transmitting element 220 can absorb the light of part of wavelength.

According to the 2nd embodiment, the image sensor 210 includes one anti-reflection coating 240, which is disposed on the upper surface 221 of the light transmitting element 220, and includes a plurality of high refractive index layers (not shown) and a plurality of low refractive index layers (not shown), which is alternately stacked by the high refractive index layers and the low refractive index layers. The anti-reflection coating 240 in the 2nd embodiment can be the same with at least one of the anti-reflection coatings 141, 142 in the 1st embodiment, but will not be limited thereto.

According to the 2nd embodiment, the image sensor 210 includes two anti-reflection structures 251, 252, wherein the anti-reflection structure 251 is disposed on the lower surface 222 of the light transmitting element 220, the anti-reflection structure 252 is disposed on the micro lens layer 232. Each of the anti-reflection structures 251, 252 can be substantially the same with the anti-reflection structure 150 in the 1st embodiment, but will not be described again herein.

Figure 2B:
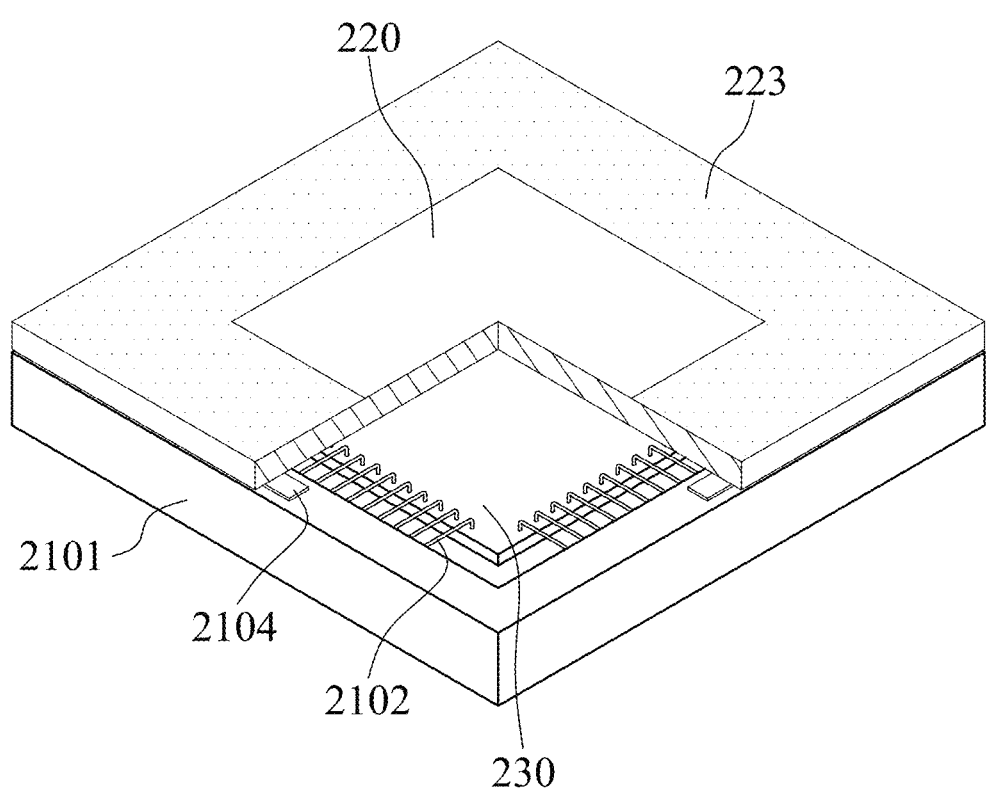
FIG. 2B is a three-dimensional schematic view of the image sensor according to the 2nd embodiment of FIG. 2A.
Figure 2C:
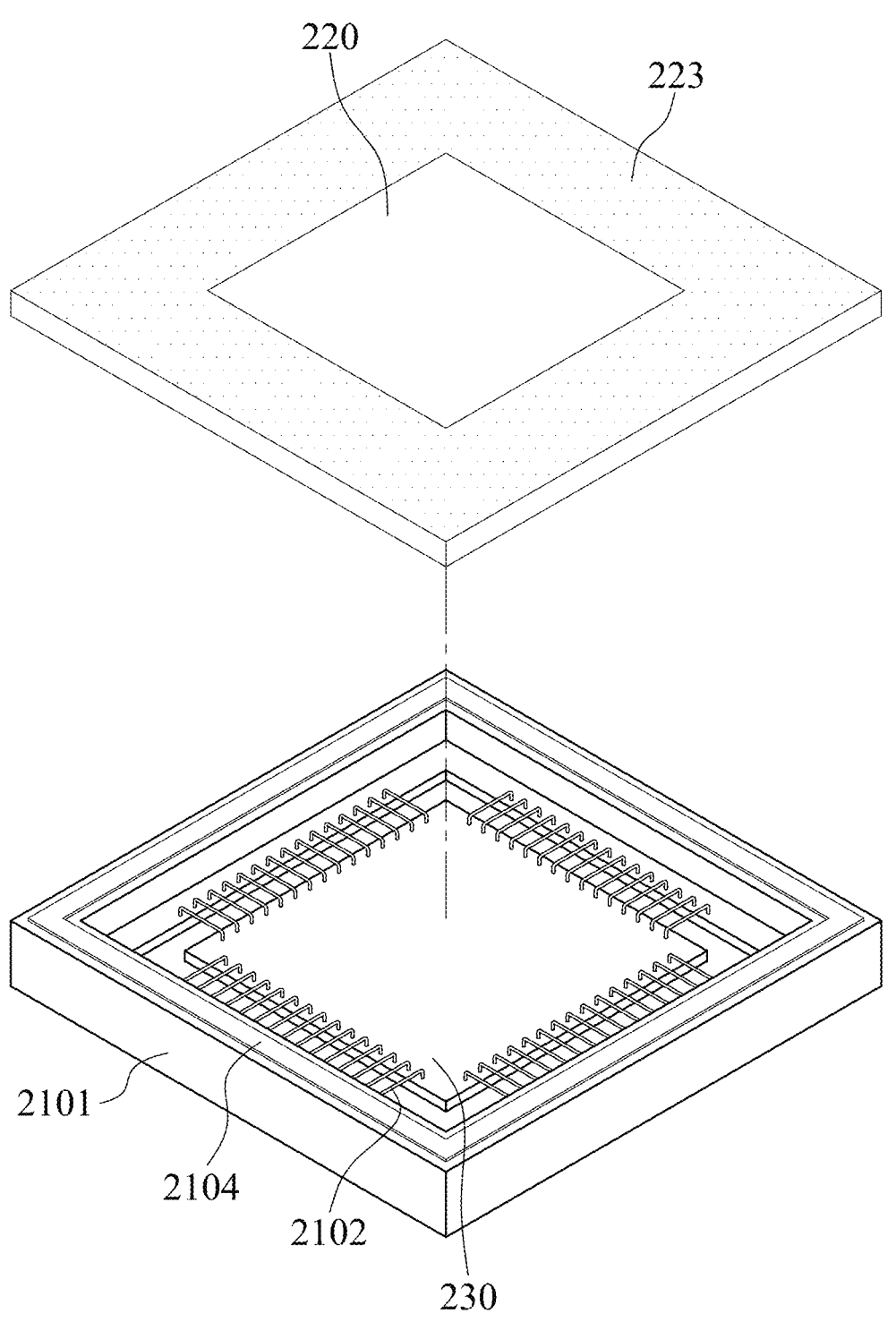
FIG. 2C is an exploded view of the image sensor according to the 2nd embodiment of FIG. 2A.

FIG. 2B is a three-dimensional schematic view of the image sensor 210 according to the 2nd embodiment of FIG. 2A. FIG. 2C is an exploded view of the image sensor 210 according to the 2nd embodiment of FIG. 2A. In FIG. 2A, FIG. 2B and FIG. 2C, the image sensor 210 can further include a plurality of conducting wires 2102 and an adhesive 2104. The conducting wires 2102 connect the image sensor die 230 and the substrate 2101. The light transmitting element 220 can further include a light blocking structure 223, which is for blocking the light. That is, the light blocking structure 223 can cover the peripheral area so as to avoid the stray light be reflected by the elements disposed on the peripheral area of the image sensor die 230 into the image sensing area. The light transmitting element 220 is stacked above the image sensor die 230 via the adhesive 2104 so as to form the gap between the micro lens layer 232 of the image sensor die 230 and the light transmitting element 220.

Furthermore, according to the 2nd embodiment, the average reflectances of the surfaces with the anti-reflection coating 240 and the anti-reflection structures 251, 252 corresponding to the light with specific ranges of wavelength can be the same values or satisfy the same ranges in the 1st embodiment, and will not be described again herein.

3rd Embodiment

Figure 3A:
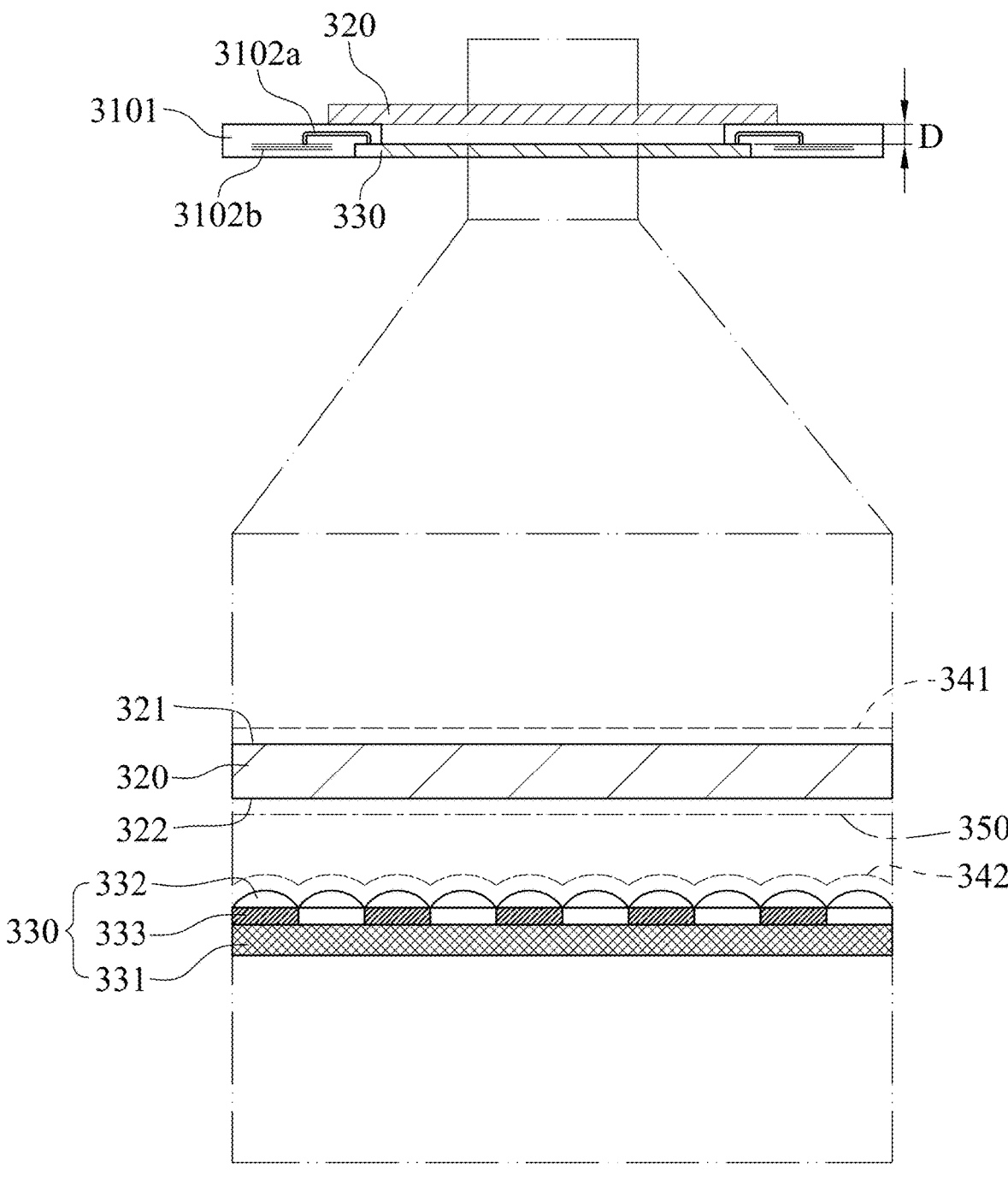
FIG. 3A is a schematic view of an image sensor according to the 3rd embodiment of the present disclosure.

FIG. 3A is a schematic view of an image sensor 310 according to the 3rd embodiment of the present disclosure, wherein the image sensor 310 in FIG. 3A can be applied to the imaging lens assembly module 100 as the image sensor 110 shown in FIG. 1A, but the structure and formation of the imaging lens assembly module will not be limited thereto. In FIG. 3A, the image sensor 310 includes an image sensor die 330, a light transmitting element 320, two anti-reflection coatings 341, 342 and one anti-reflection structure 350. According to the 3rd embodiment, the anti-reflection coating 341, the light transmitting element 320, the anti-reflection structure 350, the anti-reflection coating 342 and the image sensor die 330 are disposed in order from an object side to an image side of the imaging lens assembly module (not shown) which is applied, and the image sensor die 330 is disposed on a substrate 3101, but the present disclosure will not be limited to the aforementioned arrangement.

The image sensor die 330 includes a photoelectric conversion layer 331, a filter layer 333 and a micro lens layer 332, wherein the photoelectric conversion layer 331 is for converting a light into an electronic signal, which is disposed on the substrate 3101, and the micro lens layer 332 is disposed above the photoelectric conversion layer 331 for converging the light onto the photoelectric conversion layer 331. The filter layer 333, which is disposed between the photoelectric conversion layer 331 and the micro lens layer 332, and is arranged in array corresponding to the micro lens layer 332. The detail of the photoelectric conversion layer 331, the filter layer 333 and the micro lens layer 332 can be the same with the description in the 1st embodiment, and will not be described again herein.

The light transmitting element 320 is disposed above the micro lens layer 332, and there is a gap formed between the light transmitting element 320 and the micro lens layer 332 (in the 3rd embodiment, a distance of the gap between the light transmitting element 320 and the micro lens layer 332 is D, D=0.08 mm). The light passes through the light transmitting element 320 and incidents into the image sensor 310. The light transmitting element 320 includes a lower surface 322 and an upper surface 321, wherein the lower surface 322 is disposed corresponding to the micro lens layer 332, and the upper surface 321 is disposed relative to the lower surface 322. The material of the light transmitting element 320 includes a light absorbing material, which can be glass material or plastic material, but will not be limited thereto. Specifically, the light absorbing material can be configured on demand, so that the light transmitting element 320 can absorb the light of part of wavelength.

According to the 3rd embodiment, the image sensor 310 includes two anti-reflection coatings 341, 342, wherein the anti-reflection coating 341 is disposed on the upper surface 321 of the light transmitting element 320, the anti-reflection coating 342 is disposed on the micro lens layer 332. Each of the anti-reflection coatings 341, 342 includes a plurality of high refractive index layers (not shown) and a plurality of low refractive index layers (not shown), which is alternately stacked by the high refractive index layers and the low refractive index layers. The anti-reflection coatings 341, 342 in the 3rd embodiment can be the same with at least one of the anti-reflection coatings 141, 142 in the 1st embodiment, but will not be limited thereto.

According to the 3rd embodiment, the image sensor 310 includes one anti-reflection structure 350, wherein the anti-reflection structure 350 is disposed on the lower surface 322 of the light transmitting element 320. The anti-reflection structure 350 can be substantially the same with the anti-reflection structure 150 according to the 1st embodiment, and will not be described again herein.

Figure 3B:
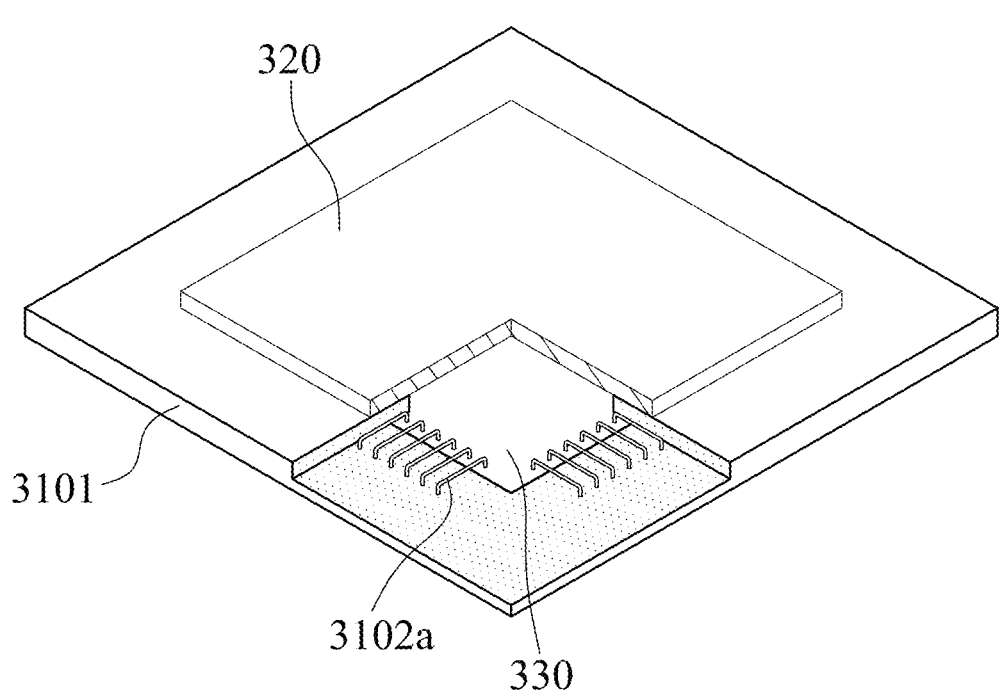
FIG. 3B is a three-dimensional schematic view of the image sensor according to the 3rd embodiment of FIG. 3A.
Figure 3C:
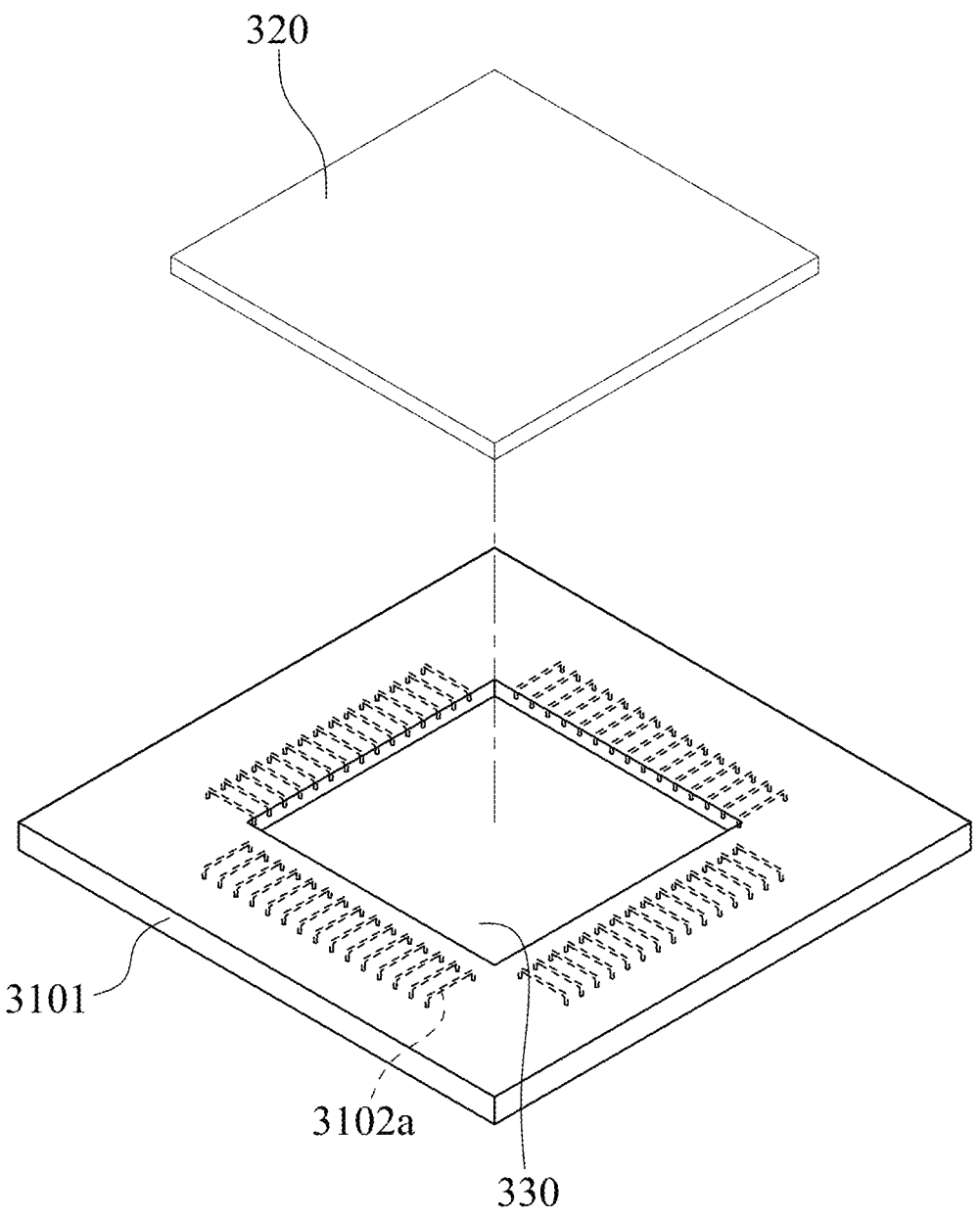
FIG. 3C is an exploded view of the image sensor according to the 3rd embodiment of FIG. 3A.

FIG. 3B is a three-dimensional schematic view of the image sensor 310 according to the 3rd embodiment of FIG. 3A. FIG. 3C is an exploded view of the image sensor 310 according to the 3rd embodiment of FIG. 3A. In FIG. 3A, FIG. 3B and FIG. 3C, the image sensor 310 can further include a plurality of conducting wires 3102a, which connect the image sensor die 330 and the substrate 3101. The substrate 3101 can include a plurality of circuit structure layers 3102b, which are stacked with each other and embedded into the substrate 3101. The circuit structure layers

3102*b* are electrically connected with the conducting wires 3102*a*. Hence, the thickness of the image sensor 310 can be reduced. According to the 3rd embodiment, the number of circuit structure layers 3102*b* is three, but the present disclosure will not be limited thereto.

Furthermore, according to the 3rd embodiment, the average reflectances of the surfaces with the anti-reflection coatings 341, 342 and the anti-reflection structure 350 corresponding to the light with specific ranges of wavelength can be the same values or satisfy the same ranges in the 1st embodiment, and will not be described again herein.

4th Embodiment

Figure 4:
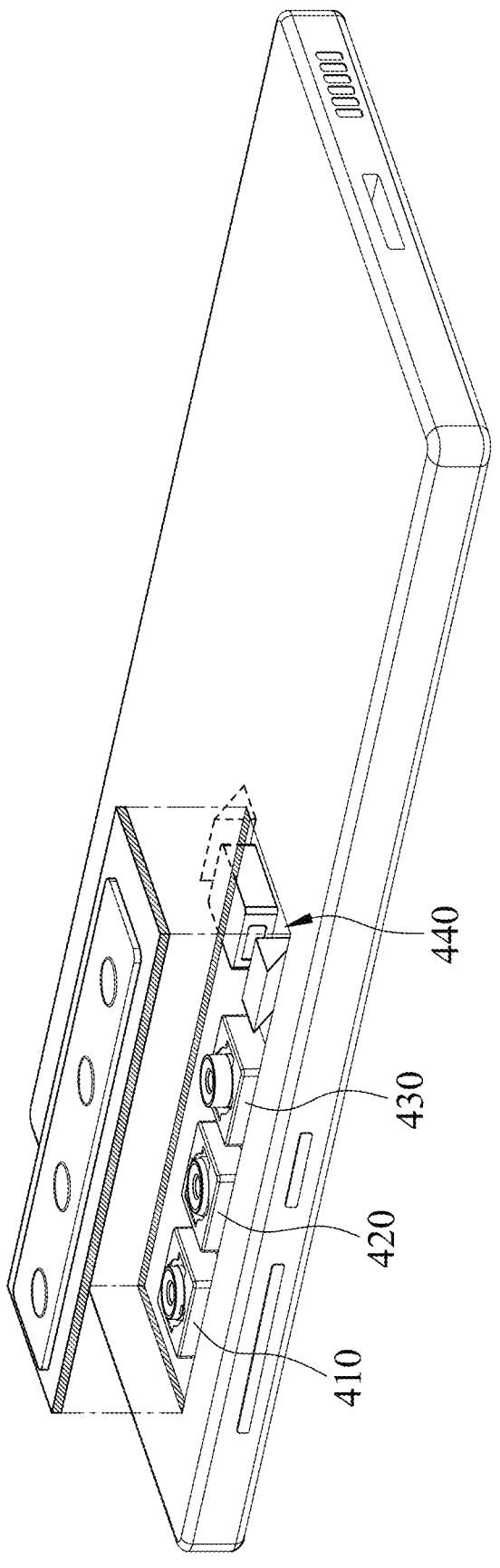
FIG. 4 is a schematic view of an electronic device according to the 4th embodiment of the present disclosure.
Figure 5:
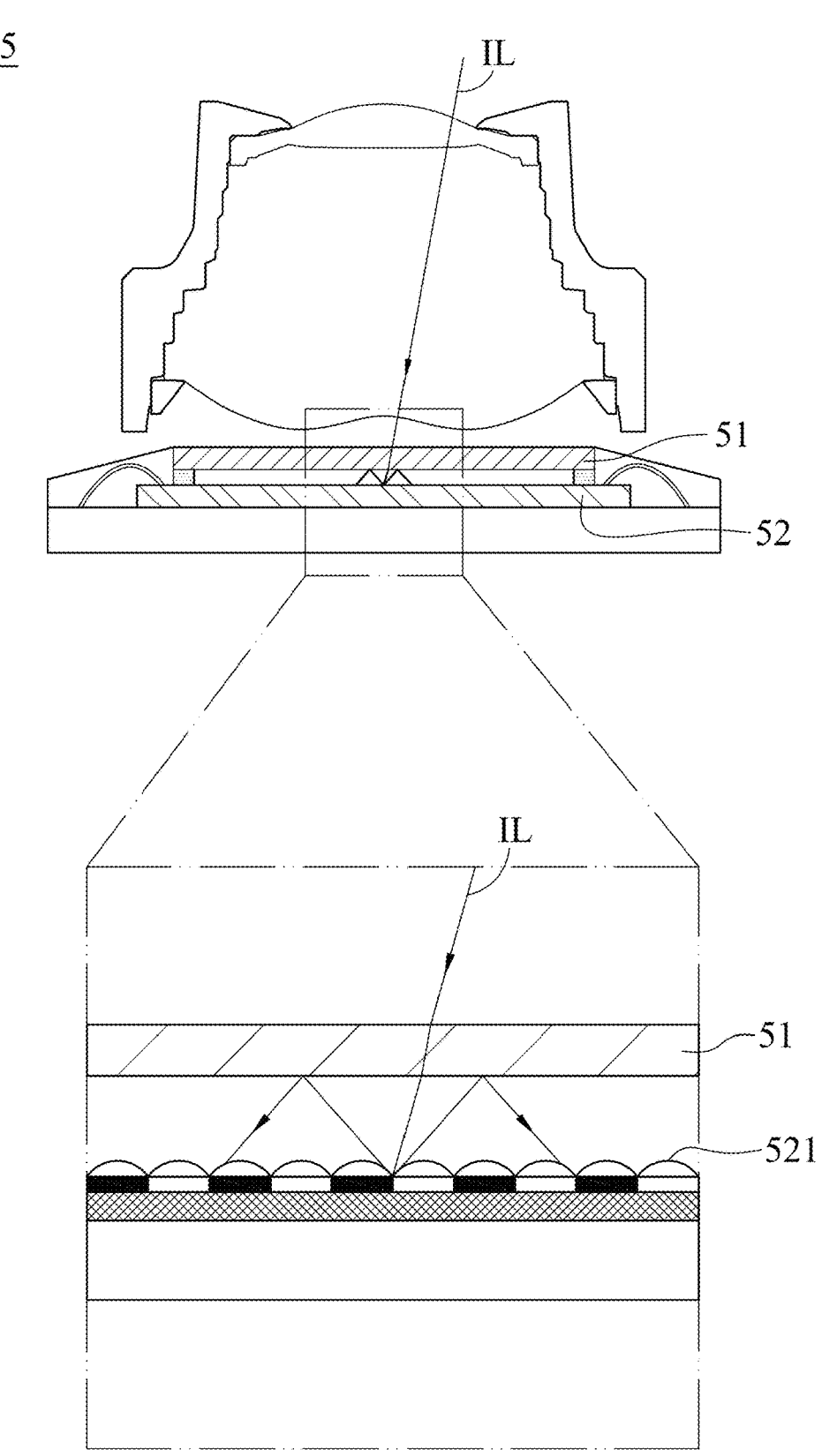
FIG. 5 is a schematic view of a light transmitting element and an image sensor die of an image sensor of an imaging lens assembly module in the prior art.

FIG. 4 is a schematic view of an electronic device 40 according to the 4th embodiment of the present disclosure. In FIG. 4, the electronic device 40 includes four imaging lens assembly modules, which are an ultra-wide angle imaging lens assembly module 410, a wide angle imaging lens assembly module 420, a telephoto imaging lens assembly module 430 and an ultra-telephoto imaging lens assembly module 440, and which can be the imaging lens assembly module of any one of the foregoing 1st to 3rd embodiments, respectively. Each of the ultra-wide angle imaging lens assembly module 410, the wide angle imaging lens assembly module 420, the telephoto imaging lens assembly module 430 and the ultra-telephoto imaging lens assembly module 440 can include any one of the image sensors in the 1st to 3rd embodiments, and will not be limited thereto.

In detail, the field of view of the ultra-wide angle imaging lens assembly module 410 can be 93 degrees to 175 degrees, the field of view of the wide angle imaging lens assembly module 420 can be 65 degrees to 90 degrees, the field of view of the telephoto imaging lens assembly module 430 can be 30 degrees to 60 degrees, the field of view of the ultra-telephoto imaging lens assembly module 440 can be 5 degrees to 30 degrees, and will not be limited thereto.

The foregoing description, for purpose of explanation, has been described with reference to specific embodiments. It is to be noted that Tables show different data of the different embodiments; however, the data of the different embodiments are obtained from experiments. The embodiments were chosen and described in order to best explain the principles of the disclosure and its practical applications, to thereby enable others skilled in the art to best utilize the disclosure and various embodiments with various modifications as are suited to the particular use contemplated. The embodiments depicted above and the appended drawings are exemplary and are not intended to be exhaustive or to limit the scope of the present disclosure to the precise forms disclosed. Many modifications and variations are possible in view of the above teachings.

What is claimed is:

1. An image sensor, comprising:

an image sensor die comprising:

a photoelectric conversion layer for converting a light into an electronic signal; and a micro lens layer disposed above the photoelectric conversion layer for converging the light onto the photoelectric conversion layer;

a light transmitting element disposed above the micro lens layer, and a gap formed between the light transmitting element and the micro lens layer, the light passing through the light transmitting element and then traveling into the image sensor, the light transmitting element comprising:

a lower surface disposed corresponding to the micro lens layer; and an upper surface disposed relative to the lower surface;

at least one anti-reflection coating, at least disposed on the upper surface of the light transmitting element, wherein the at least one anti-reflection coating comprises a plurality of high refractive index layers and a plurality of low refractive index layers, which is alternately stacked by the high refractive index layers and the low refractive index layers; and at least one anti-reflection structure disposed on at least one of the lower surface of the light transmitting element and the micro lens layer, the at least one anti-reflection structure comprising a plurality of ridge-like protrusions which are non-directionally extended from a disposing surface, wherein a bottom of each of the ridge-like protrusions is closer to the disposing surface than a top of each of the ridge-like protrusions to the disposing surface, and each of the ridge-like protrusions is tapered from the bottom to the top.

2. The image sensor of claim 1, wherein an average reflectance of a surface with the at least one anti-reflection coating corresponding to the light with a wavelength from 440 nm to 680 nm is $R_{4468}$, the following condition is satisfied:

$$0.08\% \leq R_{4468} \leq 0.5\%.$$

3. The image sensor of claim 2, wherein an average reflectance of the surface with the at least one anti-reflection coating corresponding to the light with a wavelength from 680 nm to 800 nm is $R_{6880}$, the following condition is satisfied:

$$0.08\% \leq R_{6880} \leq 0.6\%.$$

4. The image sensor of claim 3, wherein an average reflectance of the surface with the at least one anti-reflection coating corresponding to the light with a wavelength from 420 nm to 450 nm is $R_{4245}$, the following condition is satisfied:

$$0.06\% \leq R_{4245} \leq 0.4\%.$$

5. The image sensor of claim 1, wherein an average reflectance of a surface with the at least one anti-reflection structure corresponding to the light with a wavelength from 380 nm to 880 nm is $R_{3888}$, the following condition is satisfied:

$$0.01\% \leq R_{3888} \leq 0.3\%.$$

6. The image sensor of claim 1, wherein an average structure height of the ridge-like protrusions is larger than or equal to 70 nm, and smaller than or equal to 350 nm.

7. The image sensor of claim 1, wherein at least one anti-reflection structure further comprises a structure connecting layer, the structure connecting layer comprises at least one SiO$_2$ layer, wherein a top of the at least one SiO$_2$ layer and the bottom of each of the ridge-like protrusions are physically contacted.

8. The image sensor of claim 7, wherein a partial region of the top of the at least one SiO$_2$ layer is contacted with an air.

9. The image sensor of claim 1, wherein the light transmitting element comprises a light absorbing material.

10. The image sensor of claim 1, wherein the light transmitting element further comprises a light blocking structure, which is for blocking the light.

11. The image sensor of claim 1, wherein an enclosed space is formed between the light transmitting element and the micro lens layer.

12. The image sensor of claim 1, wherein a distance of the gap between the light transmitting element and the micro lens layer is D, the following condition is satisfied:

$$0.01 \text{ mm} \leq D \leq 0.15 \text{ mm}.$$

13. An imaging lens assembly module, comprising:
the image sensor of claim 1; and
an imaging lens assembly disposed corresponding to the image sensor, and the image lens assembly comprising:
at least one lens element.

14. An electronic device, comprising:
the imaging lens assembly module of claim 13.

15. An image sensor, comprising:
an image sensor die comprising:
a photoelectric conversion layer for converting a light into an electronic signal; and
a micro lens layer disposed above the photoelectric conversion layer for converging the light onto the photoelectric conversion layer;
a light transmitting element disposed above the micro lens layer, and a gap formed between the light transmitting element and the micro lens layer, the light passing through the light transmitting element and then traveling into the image sensor, the light transmitting element comprising:
a lower surface disposed corresponding to the micro lens layer; and
an upper surface disposed relative to the lower surface;
at least one anti-reflection coating disposed on at least one of the upper surface and the lower surface of the light transmitting element and the micro lens layer, wherein the at least one anti-reflection coating comprises a plurality of high refractive index layers and a plurality of low refractive index layers, which is alternately stacked by the high refractive index layers and the low refractive index layers; and
at least one anti-reflection structure disposed on at least one of the upper surface and the lower surface of the light transmitting element and the micro lens layer, the at least one anti-reflection structure comprising a plurality of ridge-like protrusions which are non-directionally extended from a disposing surface, wherein a bottom of each of the ridge-like protrusions is closer to the disposing surface than a top of each of the ridge-like protrusions to the disposing surface, and each of the ridge-like protrusions is tapered from the bottom to the top;
wherein an average reflectance of a surface with the at least one anti-reflection coating corresponding to the light with a wavelength from 440 nm to 680 nm is R$_{4468}$, the following condition is satisfied:

$$0.08\% \leq R_{4468} \leq 0.5\%.$$

16. The image sensor of claim 15, wherein at least one anti-reflection coating is disposed on at least the upper surface of the light transmitting element.

17. The image sensor of claim 15, wherein an average reflectance of the surface with the at least one anti-reflection coating corresponding to the light with a wavelength from 680 nm to 800 nm is R$_{6880}$, the following condition is satisfied:

$$0.08\% \leq R_{6880} \leq 0.6\%.$$

18. The image sensor of claim 17, wherein an average reflectance of the surface with the at least one anti-reflection coating corresponding to the light with a wavelength from 420 nm to 450 nm is R$_{4245}$, the following condition is satisfied:

$$0.06\% \leq R_{4245} \leq 0.4\%.$$

19. The image sensor of claim 15, wherein an average reflectance of a surface with the at least one anti-reflection structure corresponding to the light with a wavelength from 380 nm to 880 nm is R$_{3888}$, the following condition is satisfied:

$$0.01\% \leq R_{3888} \leq 0.3\%.$$

20. The image sensor of claim 15, wherein an average structure height of the ridge-like protrusions is larger than or equal to 70 nm, and smaller than or equal to 350 nm.

21. The image sensor of claim 15, wherein at least one anti-reflection structure further comprises a structure connecting layer, the structure connecting layer comprises at least one SiO$_2$ layer, wherein a top of the at least one SiO$_2$ layer and the bottom of each of the ridge-like protrusions are physically contacted.

22. The image sensor of claim 21, wherein a partial region of the top of the at least one SiO$_2$ layer is contacted with an air.

23. The image sensor of claim 15, wherein the light transmitting element comprises a light absorbing material.

24. The image sensor of claim 15, wherein the light transmitting element further comprises a light blocking structure, which is for blocking the light.

25. The image sensor of claim 15, wherein an enclosed space is formed between the light transmitting element and the micro lens layer.

26. The image sensor of claim 15, wherein a distance of the gap between the light transmitting element and the micro lens layer is D, the following condition is satisfied:

$$0.01 \text{ mm} \leq D \leq 0.15 \text{ mm}.$$

27. An imaging lens assembly module, comprising:

the image sensor of claim 15; and an imaging lens assembly disposed corresponding to the image sensor, and the image lens assembly comprising:

at least one lens element.

28. An electronic device, comprising:

the imaging lens assembly module of claim 27.

\* \* \* \* \*